US012581677B2

(12) United States Patent
Peng et al.

(10) Patent No.: US 12,581,677 B2
(45) Date of Patent: **\*Mar. 17, 2026**

(54) PASSIVATION LAYERS FOR SEMICONDUCTOR DEVICES

(71) Applicant: Taiwan Semiconductor Manufacturing Co., Ltd., Hsinchu (TW)

(72) Inventors: Cheng-Yi Peng, Taipei City (TW); Ching-Hua Lee, Hsinchu City (TW); Song-Bor Lee, Zhubei City (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/434,577

(22) Filed: Feb. 6, 2024

(65) Prior Publication Data

US 2024/0243184 A1 Jul. 18, 2024

Related U.S. Application Data

(60) Continuation of application No. 17/876,816, filed on Jul. 29, 2022, now Pat. No. 11,929,422, which is a
(Continued)

(51) Int. Cl.
*H01L 29/66* (2006.01)
*H01L 29/06* (2006.01)
(Continued)

(52) U.S. Cl.
CPC ........... *H10D 30/014* (2025.01); *H10D 30/43* (2025.01); *H10D 30/6735* (2025.01);
(Continued)

(58) Field of Classification Search
CPC .... H10D 30/014; H10D 30/024; H10D 30/43; H10D 30/62; H10D 30/6211;
(Continued)

(56) References Cited

U.S. PATENT DOCUMENTS 9,093,530 B2 7/2015 Huang et al.
9,171,929 B2 10/2015 Lee et al.
(Continued)

FOREIGN PATENT DOCUMENTS

CN 109273362 A 1/2019
CN 109427588 A 3/2019
(Continued)

OTHER PUBLICATIONS

Labrot et al. "Low thermal budget for Si and SiGe surface preparation for FD-SOI technology." Applied surface science 371 (2016): 436-446.
(Continued)

*Primary Examiner* — David C Spalla
(74) *Attorney, Agent, or Firm* — Sterne, Kessler, Goldstein & Fox P.L.L.C.

(57) ABSTRACT

The structure of a semiconductor device with passivation layers on active regions of FET devices and a method of fabricating the semiconductor device are disclosed. The semiconductor device includes a substrate, first and second source/drain (S/D) regions disposed on the substrate, nanostructured channel regions disposed between the first and second S/D regions, a passivation layer, and a nanosheet (NS) structure wrapped around the nanostructured channel regions. Each of the S/D regions have a stack of first and second semiconductor layers arranged in an alternating configuration and an epitaxial region disposed on the stack of first and second semiconductor layers. A first portion of the passivation layer is disposed between the epitaxial
(Continued)

region and the stack of first and second semiconductor layers and a second portion of the passivation layer is disposed on sidewalls of the nanostructured channel regions.

20 Claims, 19 Drawing Sheets

Related U.S. Application Data division of application No. 16/807,305, filed on Mar. 3, 2020, now Pat. No. 11,695,055.

(51) Int. Cl.

| | |
|---|---|
| *H01L 29/423* | (2006.01) |
| *H01L 29/775* | (2006.01) |
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 64/01* | (2025.01) |

(52) U.S. Cl.
CPC ....... *H10D 30/6757* (2025.01); *H10D 62/121* (2025.01); *H10D 64/017* (2025.01); *H10D 64/018* (2025.01)

(58) Field of Classification Search
CPC .......... H10D 30/6212; H10D 30/6213; H10D 30/6735; H10D 30/6757; H10D 62/118; H10D 62/119; H10D 62/121; H10D 64/017; H10D 64/018; H10D 64/021; H10D 84/0158; H10D 84/0193; H10D 84/834; H10D 84/853
See application file for complete search history.

(56) References Cited

U.S. PATENT DOCUMENTS

| | | | |
|---|---|---|---|
| 9,214,555 | B2 | 12/2015 | Oxland et al. |
| 9,236,267 | B2 | 1/2016 | De et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,564,522 | B2 | 2/2017 | Cea et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,881,838 | B2 | 1/2018 | Kim et al. |
| 10,037,921 | B2 | 7/2018 | Jangjian et al. |
| 10,134,640 | B1 * | 11/2018 | Chiang ............... H10D 30/797 |
| 10,163,729 | B2 | 12/2018 | Ching et al. |
| 10,256,301 | B1 | 4/2019 | Reznicek |
| 10,297,508 | B2 | 5/2019 | Cheng et al. |
| 10,490,559 | B1 * | 11/2019 | Ando ................... H10D 84/853 |
| 10,522,616 | B2 | 12/2019 | Cho et al. |
| 10,763,368 | B2 | 9/2020 | Chiang et al. |
| 10,872,983 | B2 | 12/2020 | Yang et al. |
| 11,038,043 | B2 | 6/2021 | Cheng et al. |
| 11,527,612 | B2 * | 12/2022 | Glass ................... H10D 30/797 |
| 11,929,422 | B2 * | 3/2024 | Peng ..................... H10D 84/85 |
| 2008/0160210 | A1 | 7/2008 | Yang et al. |
| 2012/0153387 | A1 | 6/2012 | Murthy et al. |
| 2014/0256105 | A1 | 9/2014 | Wann et al. |
| 2016/0204245 | A1 | 7/2016 | Jangjian et al. |
| 2018/0151717 | A1 | 5/2018 | Cheng et al. |
| 2018/0323312 | A1 | 11/2018 | Van Dal et al. |
| 2018/0366375 | A1 * | 12/2018 | Chen .................... H10D 62/116 |
| 2019/0027570 | A1 | 1/2019 | Ching et al. |
| 2019/0067452 | A1 * | 2/2019 | Cheng ................. H10D 62/116 |
| 2019/0131431 | A1 | 5/2019 | Cheng et al. |
| 2019/0198639 | A1 * | 6/2019 | Kim ..................... H10D 30/014 |
| 2019/0305104 | A1 | 10/2019 | Xie et al. |
| 2020/0043927 | A1 | 2/2020 | Wang et al. |
| 2020/0044084 | A1 | 2/2020 | Yeh et al. |
| 2020/0119155 | A1 | 4/2020 | Cheng et al. |
| 2021/0280486 | A1 | 9/2021 | Peng et al. |
| 2022/0384613 | A1 | 12/2022 | Peng et al. |

FOREIGN PATENT DOCUMENTS

| | | |
|---|---|---|
| DE | 11 2011 106 023 | 9/2014 |
| DE | 10 2015 100 860 | 2/2016 |
| DE | 10 2016 105 389 | 11/2016 |
| DE | 10 2017 123 334 | 4/2019 |
| DE | 10 2018 108 821 | 4/2019 |
| JP | 2014508396 A | 4/2014 |
| KR | 20150021448 A | 3/2015 |
| KR | 20150143254 A | 12/2015 |
| KR | 20160086732 A | 7/2016 |
| KR | 20160099445 A | 8/2016 |
| KR | 20180060912 A | 6/2018 |
| KR | 20180113118 A | 10/2018 |
| KR | 20190023527 A | 3/2019 |
| KR | 20190024625 A | 3/2019 |
| KR | 20200014235 A | 2/2020 |

OTHER PUBLICATIONS

Lei et al. "Advantage of siconi preclean over wet clean for pre salicide applications beyond 65nm node." 2006 IEEE International Symposium on Semiconductor Manufacturing. IEEE, (2006): 393-396.

* cited by examiner

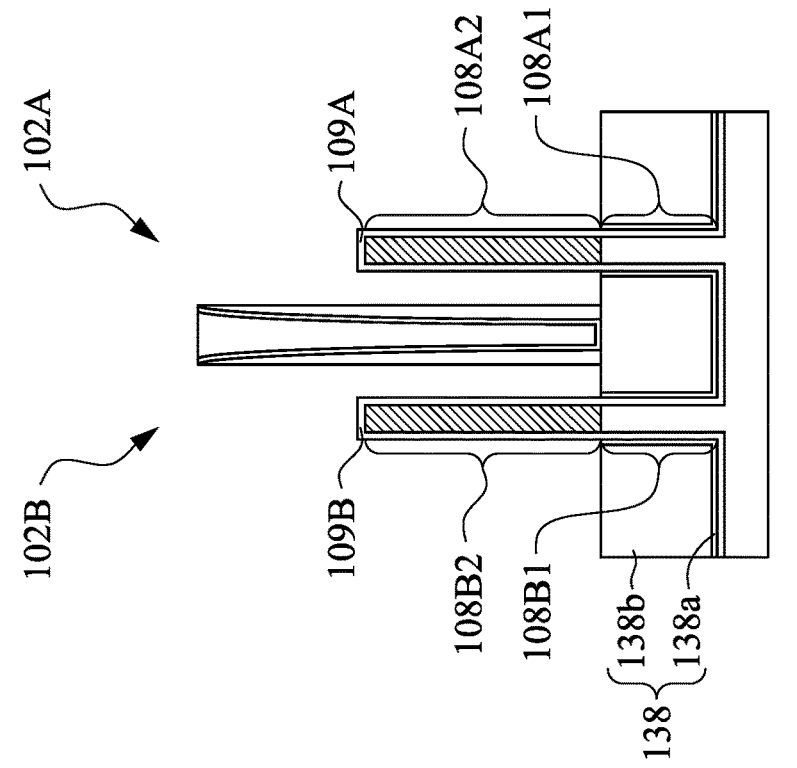
FIG. 2B
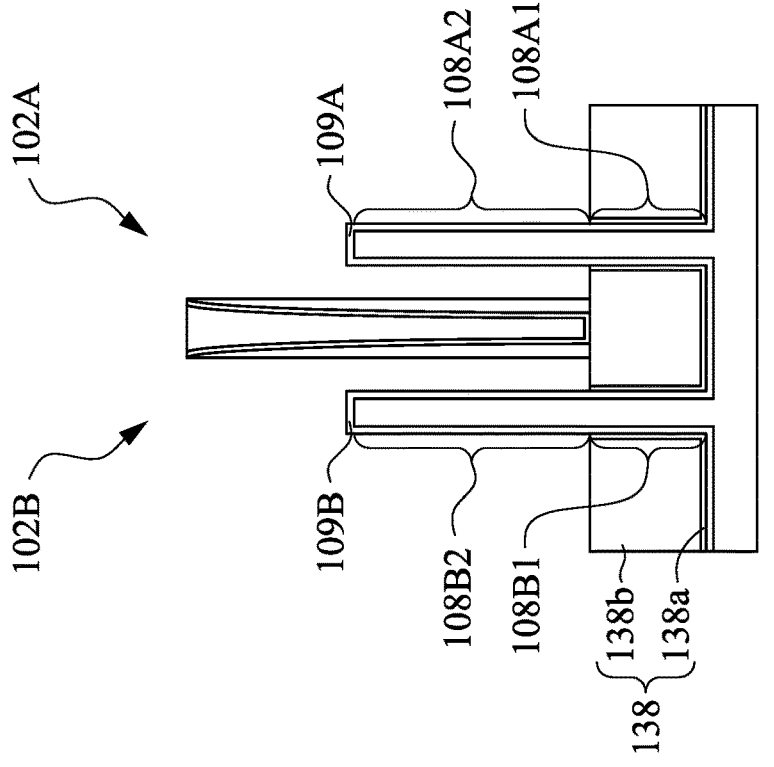
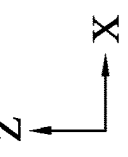
FIG. 2A

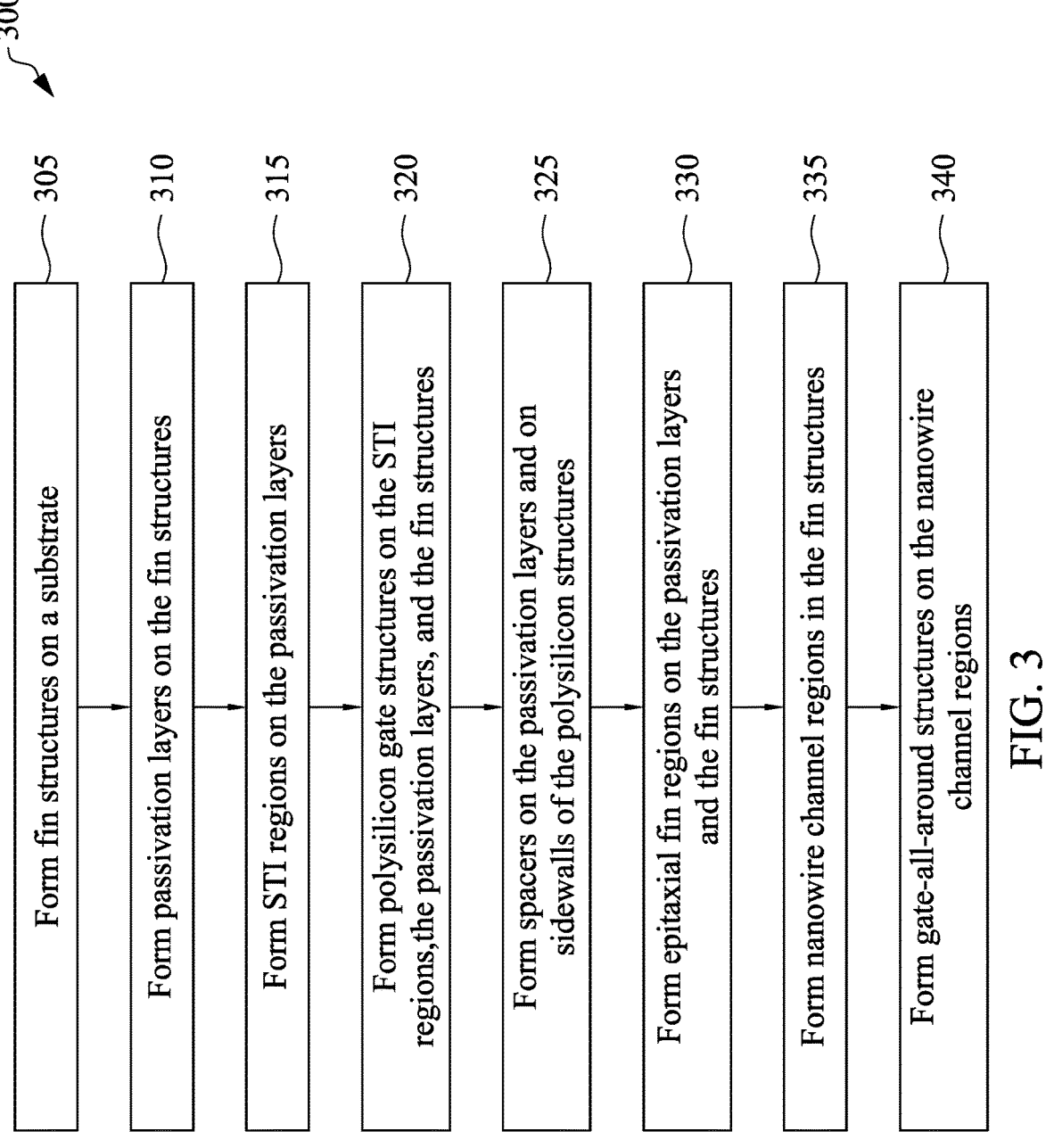

300

305 — Form fin structures on a substrate

310 — Form passivation layers on the fin structures

315 — Form STI regions on the passivation layers

320 — Form polysilicon gate structures on the STI regions, the passivation layers, and the fin structures 325 — Form spacers on the passivation layers and on sidewalls of the polysilicon structures 330 — Form epitaxial fin regions on the passivation layers and the fin structures 335 — Form nanowire channel regions in the fin structures 340 — Form gate-all-around structures on the nanowire channel regions

FIG. 3

PASSIVATION LAYERS FOR SEMICONDUCTOR DEVICES

CROSS-REFERENCE TO RELATED APPLICATIONS

This application is a continuation of U.S. patent application Ser. No. 17/876,816, titled "Passivation Layers for Semiconductor Devices," filed on Jul. 29, 2022, which is a divisional of U.S. patent application Ser. No. 16/807,305, titled "Passivation Layers for Semiconductor Devices," filed on Mar. 3, 2020, each of which is incorporated herein by reference in its entirety.

BACKGROUND

With advances in semiconductor technology, there has been increasing demand for higher storage capacity, faster processing systems, and higher performance. To meet these demands, the semiconductor industry continues to scale down the dimensions of semiconductor devices, such as metal oxide semiconductor field effect transistors (MOSFETs), including planar MOSFETs and fin field effect transistors (finFETs). Such scaling down has increased the complexity of semiconductor manufacturing processes.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 2A-2H illustrate cross-sectional views of different configurations of channel regions of a semiconductor device with passivation layers, in accordance with some embodiments.

FIG. 3 is a flow diagram of a method for fabricating a semiconductor device with passivation layers, in accordance with some embodiments.

FIGS. 4A-13A illustrate isometric views of a semiconductor device with passivation layers at various stages of its fabrication process, in accordance with some embodiments.

FIGS. 4B-13B illustrate cross-sectional views of a semiconductor device with passivation layers at various stages of its fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figures 1A, 1B:
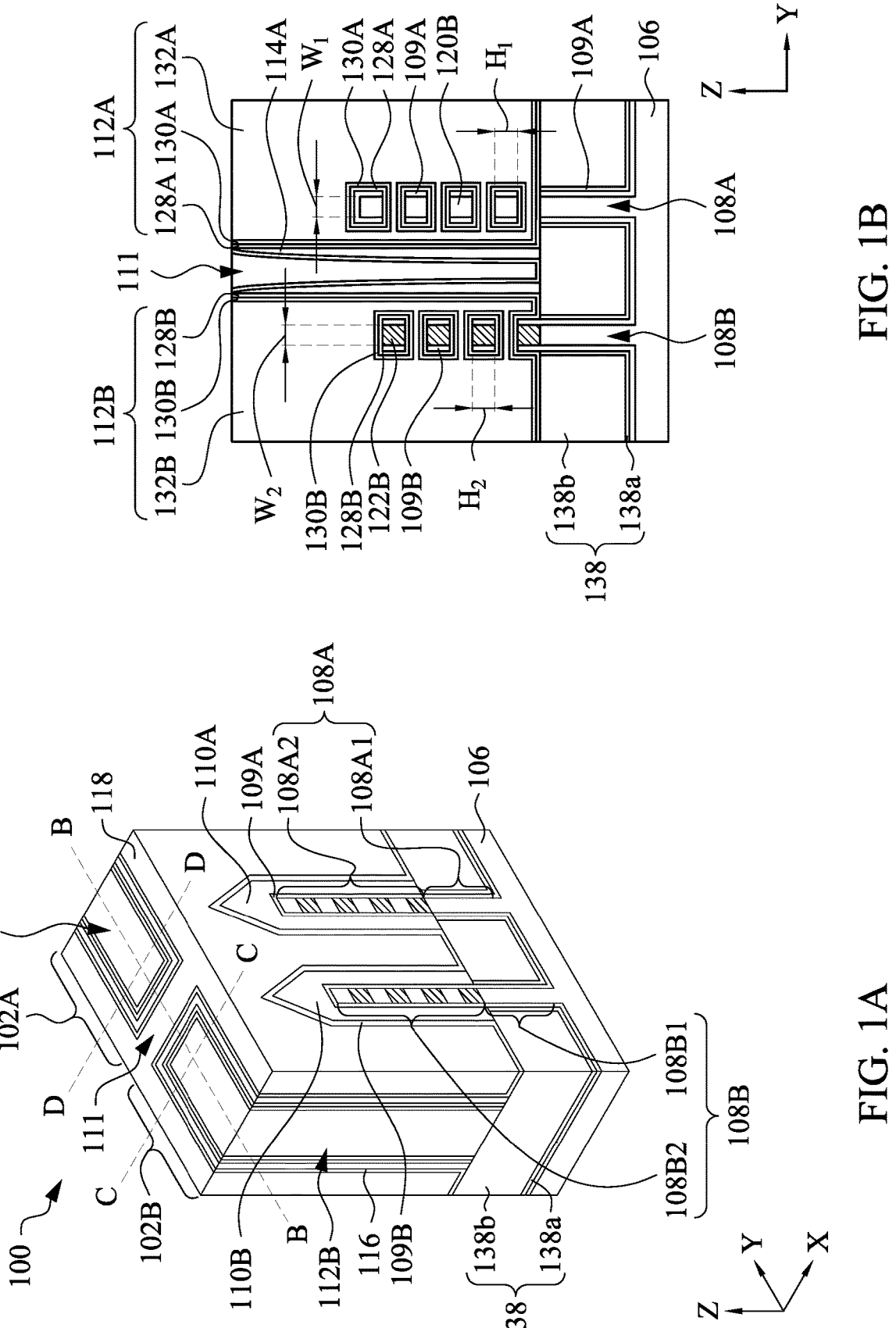
FIGS. 1A and 1B-1D illustrate an isometric view and cross-sectional views of a semiconductor device with passivation layers, respectively, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the process for forming a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature. In addition, the present disclosure may repeat reference numerals and/or letters in the various examples. This repetition does not in itself dictate a relationship between the various embodiments and/or configurations discussed.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "etch selectivity" refers to the ratio of the etch rates of two different materials under the same etching conditions.

As used herein, the term "deposition selectivity" refers to the ratio of the deposition rates on two different materials or surfaces under the same deposition conditions.

As used herein, the term "high-k" refers to a high dielectric constant. In the field of semiconductor device structures and manufacturing processes, high-k refers to a dielectric constant that is greater than the dielectric constant of $SiO_2$ (e.g., greater than 3.9).

As used herein, the term "p-type" defines a structure, layer, and/or region as being doped with p-type dopants, such as boron.

As used herein, the term "n-type" defines a structure, layer, and/or region as being doped with n-type dopants, such as phosphorus.

In some embodiments, the terms "about" and "substantially" can indicate a value of a given quantity that varies within 5% of the value (e.g., ±1%, ±2%, ±3%, ±4%, ±5% of the value). These values are, of course, merely examples and are not intended to be limiting. It is to be understood that the terms "about" and "substantially" can refer to a percentage of the values as interpreted by those skilled in relevant art(s) in light of the teachings herein.

The fin structures disclosed herein may be patterned by any suitable method. For example, the fin structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures.

The present disclosure provides example structures and methods for reducing resistance in active regions (e.g., channel regions and/or source/drain regions) of FET devices (e.g., finFETs, gate-all-around FETs, MOSFETs, etc.). Reducing resistance in the active regions can increase the drive current of the FET devices, thus resulting in improved FET device performance.

The example structures and methods provide passivation layers on the active regions of FET devices to improve the surface quality of the active regions. The surface quality can be improved by mitigating surface defects with the passivation layers. The surface defects on the active regions can be in the form of vacancies created by dangling bonds on the surface of the active regions. The vacancies can trap charge carriers traveling through the active regions of the FET devices during operation and reduce the drive current of the FET devices. The passivation layers can react with these dangling bonds to reduce or eliminate the dangling bond induced surface defects on the active regions. Eliminating such surface defects on the active regions of FET devices with the passivation layers disclosed herein can improve the drive current of the FET devices by, for example, about 20% to about 50% compared to the drive current of FET devices without such passivation layers on their active regions. In some embodiments, the passivation layers can comprise fluorine, nitrogen, hydrogen, and/or chlorine atoms that can react with the dangling bonds on the surface of the active regions to reduce or eliminate the vacancy-induced defects on the surface of the active regions.

Figures 1C, 1D:
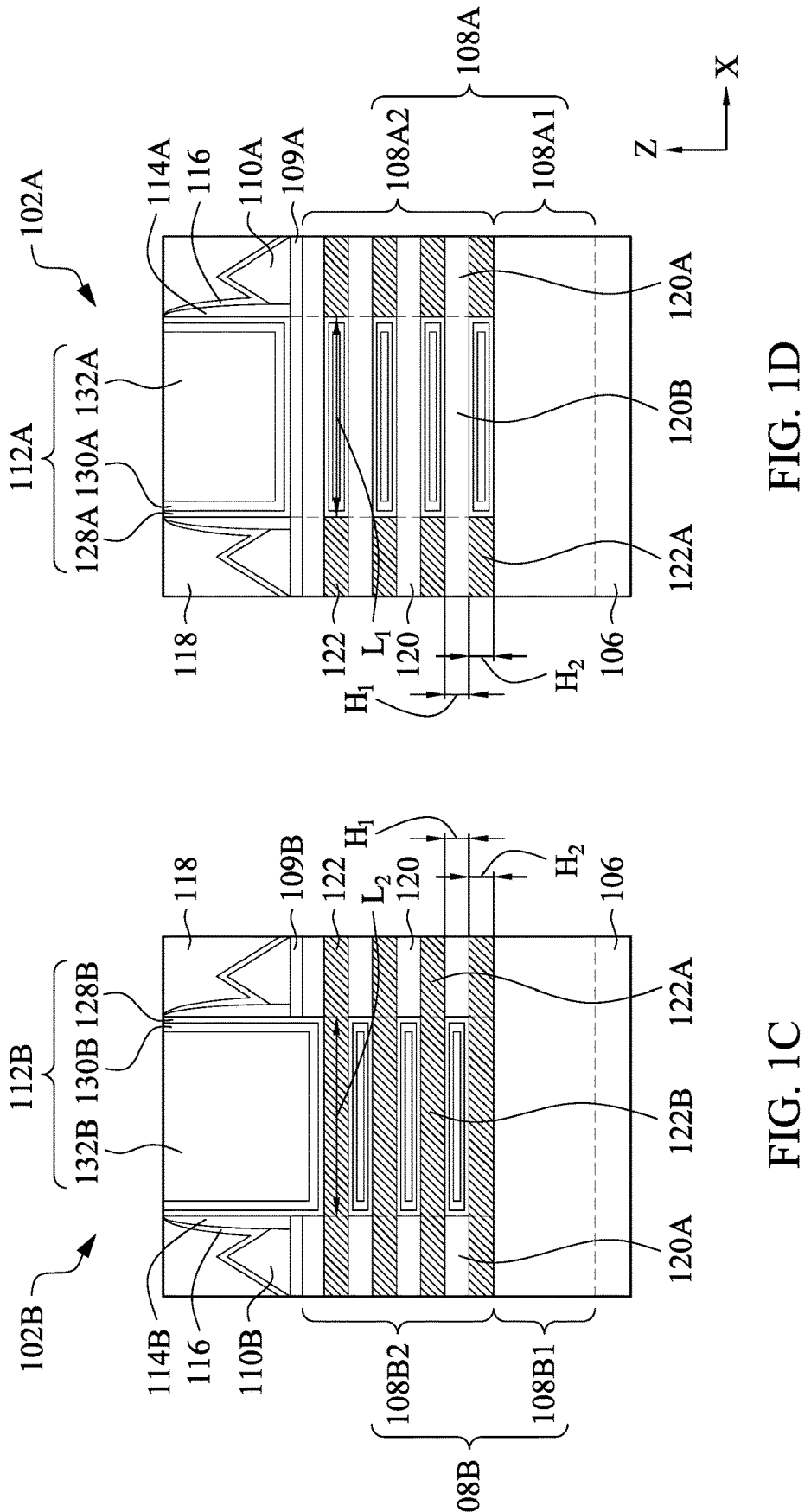

A semiconductor device 100 having FETs 102A-102B is described with reference to FIGS. 1A-1D, according to some embodiments. FIG. 1A illustrates an isometric view of semiconductor device 100, according to some embodiments. FIG. 1B-1D illustrate cross-sectional views along lines B-B, C-C, and D-D of semiconductor device 100 of FIG. 1A, respectively, according to some embodiments. In some embodiments, FETs 102A-102B can be both p-type FETs (PFETs) or n-type FETs (NFETs) or one of each conductivity type FETs. Even though two FETs are discussed with reference to FIGS. 1A-1D, semiconductor device 100 can have any number of FETs. The discussion of elements of FET 102A-102B with the same annotations applies to each other, unless mentioned otherwise. The isometric view and cross-sectional views of semiconductor device 100 are shown for illustration purposes and may not be drawn to scale.

Referring to FIGS. 1A-1D, FETs 102A-102B can be formed on a substrate 106. Substrate 106 can be a semiconductor material such as, but not limited to, silicon. In some embodiments, substrate 106 can include a crystalline silicon substrate (e.g., wafer). In some embodiments, substrate 106 can include (i) an elementary semiconductor, such as germanium (Ge); (ii) a compound semiconductor including silicon carbide, gallium arsenide, gallium phosphide, indium phosphide, indium arsenide, indium antimonide, and/or a III-V semiconductor material; (iii) an alloy semiconductor including silicon germanium (SiGe), silicon germanium carbide, germanium stannum, silicon germanium stannum, gallium arsenic phosphide, gallium indium phosphide, gallium indium arsenide, gallium indium arsenic phosphide, aluminum indium arsenide, and/or aluminum gallium arsenide; (iv) a silicon-on-insulator (SOI) structure; (v) a silicon germanium (SiGe)-on insulator structure (SiGeOI); (vi) germanium-on-insulator (GeOI) structure; or (vii) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

FETs 102A-102B can include fin structures 108A-108B disposed on substrate 106, passivation layers 109A-109B disposed on fin structures 108A-108B, epitaxial fin regions 110A-110B disposed on passivation layers 109A-109B, gate structures 112A-112B (also referred to as gate-all-around (GAA) structures 112A-112B or nanosheet (NS) structures 112A-112B) disposed on portions of fin structures 108A-108B not covered by epitaxial fin regions 110A-110B, and spacers 114A-114B disposed on passivation layers 109A-109B and gate structures 112A-112B, respectively.

As shown in FIGS. 1C-1D, fin structures 108A-108B can include fin base portions 108A1-108B1 and fin top portions 108A2-10B2 disposed on fin base portions 108A1-108B1, respectively. In some embodiments, fin base portions 108A1-108B1 can include material similar to substrate 106. Fin base portions 108A1-108B1 can be formed from a photolithographic patterning and an etching of substrate 106. Fin top portions 108A2-108B2 can include first and second semiconductor layers 120 and 122 stacked in an alternating configuration. Each of first semiconductor layers 120 can have (i) first fin regions 120A underlying epitaxial fin regions 110A-110B, and (ii) second fin regions 120B in FET 102A underlying gate structure 112A and in FET 102B (not shown in FIG. 1A-1D; shown in FIG. 5A) prior to being etched to form gate structure 112B, as described in further detail below. Similarly, each of second semiconductor layers 122 can have (i) first fin regions 122A underlying epitaxial fin regions 110A-110B, and (ii) second fin regions 122B in FET 102B underlying gate structure 112B and in FET 102A (not shown in FIG. 1A-1D; shown in FIG. 5A) prior to being etched to form gate structure 112A, as described in further detail below. Second fin regions 120B and 122B can be referred to as nanostructured channel regions 120B and 122B of FETs 102A-102B after the formation of gate structures 112A-112B, respectively, as shown in FIGS. 1B-1D.

First and second semiconductor layers 120 and 122 can be epitaxially grown and can include semiconductor materials different from each other. In some embodiments, first and second semiconductor layers 120 and 122 can include semiconductor materials with oxidation rates and/or etch selectivity different from each other. In some embodiments, first and second semiconductor layers 120 and 122 can include semiconductor materials similar to or different from substrate 106. First and second semiconductor layers 120 and 122 can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, first semiconductor layers 120 can include Si for n-type FET 102A and SiGe for p-type FET 102B or first semiconductor layers 120 can include SiGe for p-type FET 102A and Si for n-type FET 102B if semiconductor device 100 is a complementary metal oxide semiconductor (CMOS) device. In some embodiments, both first and semiconductor layers 120 and 122 can include Si for n-type FETs 102A-102B or SiGe for p-type FETs 102A-102B. In some embodiments, first and second semiconductor layers 120 and 122 can include SiGe with Ge in a range from about 25 atomic percent to about 50 atomic percent with any remaining atomic percent being Si or can include Si without any substantial amount of Ge. The semiconductor materials of first and/or second semiconductor layers 120 and 122 can be undoped or can be in-situ doped during their epitaxial growth process using: (i) p-type dopants, such as boron, indium, or gallium; and/or (ii) n-type dopants, such as phosphorus or arsenic.

Referring to FIG. 1B, nanostructured channel regions 120B and 122B can have respective vertical dimensions $H_1$ and $H_2$ (e.g., thickness or diameter) along a Z-axis ranging from about 5 nm to about 30 nm and respective horizontal dimensions $W_1$ and $W_2$ (e.g., width or diameter) along a Y-axis ranging from about 5 nm to about 30 nm. The ratios of $H_1/W_1$ and $H_2/W_2$ can range from about 0.2 to about 5. Though rectangular cross-sections of nanostructured channel regions 120B and 122B are shown in FIG. 1B, nanostructured channel regions 120B and 122B can have cross-sections of other geometric shapes (e.g., circular, elliptical, triangular, or polygonal). Further, nanostructured channel regions 120B and 122B can have respective horizontal dimensions $L_1$ (FIG. 1D) and $L_2$ (FIG. 1C) along an X-axis ranging from about 10 nm to about 100 nm. The ratios of $L_1/H_1$ and $L_2/H_2$ can range from about 2 to about 20. In some embodiments, dimensions $H_1$ and $H_2$, $W_1$ and $W_2$, and $L_1$ and $L_2$ can be equal to or different from each other, respectively. In some embodiments, the ratios of $H_1/W_1$ and $H_2/W_2$, and $L_1/H_1$ and $L_2/H_2$ can be equal to or different from each other, respectively.

In some embodiments, fin base portions 108A1-108B1 and fin top portions 108A2-108B2 can have vertical dimensions (e.g., heights) along a Z-axis, each ranging from about 40 nm to about 60 nm. The vertical dimensions of fin base portions 108A1-108B1 and fin top portions 108A2-108B2 can be equal to or different from each other and can have values such that the total height of fin structures 108A-108B ranges from about 80 nm to about 120 nm, respectively.

Referring to FIGS. 1A-1D, passivation layers 109A-109B can be disposed on surfaces of fin top portions 108A2-108B2 underlying epitaxial fin regions 110A-110B, respectively, and on side surfaces of fin base portions 108A1-108B1, respectively. In addition, passivation layers 109A-109B can be disposed on side surface of nanostructured channel regions 120B and 122B, respectively. In some embodiments, passivation layer 109A can be disposed on top surface of the top most first semiconductor layer 120, as shown in FIG. 1D and passivation layer 109B can be disposed on top surface of the top most fin regions 120A as shown in FIG. 1C. Passivation layers 109A-109B can improve the surface quality of these passivation layer covered surfaces of fin structures 108A-108B by reducing or eliminating dangling bond induced vacancies on these surfaces. The vacancies can trap charge carriers and reduce the drive currents of FETs 102A-102B during their operation. Reducing or eliminating these vacancies can increase the drive currents of FETs 102A-102B by about 20% to about 50% compared to FETs without passivation layers such as passivation layers 109A-109B.

In some embodiments, passivation layers 109A-109B can be a nitride, oxide, fluoride, chloride, and/or sulfide film. In some embodiments, passivation layers 109A-109B can include fluorine, chlorine, nitrogen, oxygen, hydrogen, deuterium, and/or sulfur atoms that can bond with the dangling bonds to reduce or eliminate the vacancies on the above mentioned surfaces of fin structures 108A-108B. Passivation layers 109A-109B can be substantially conformally deposited on these surfaces of fin structures 108A-108B and can have a thickness ranging from about 5 Å to about 5 nm.

Figure 1E:
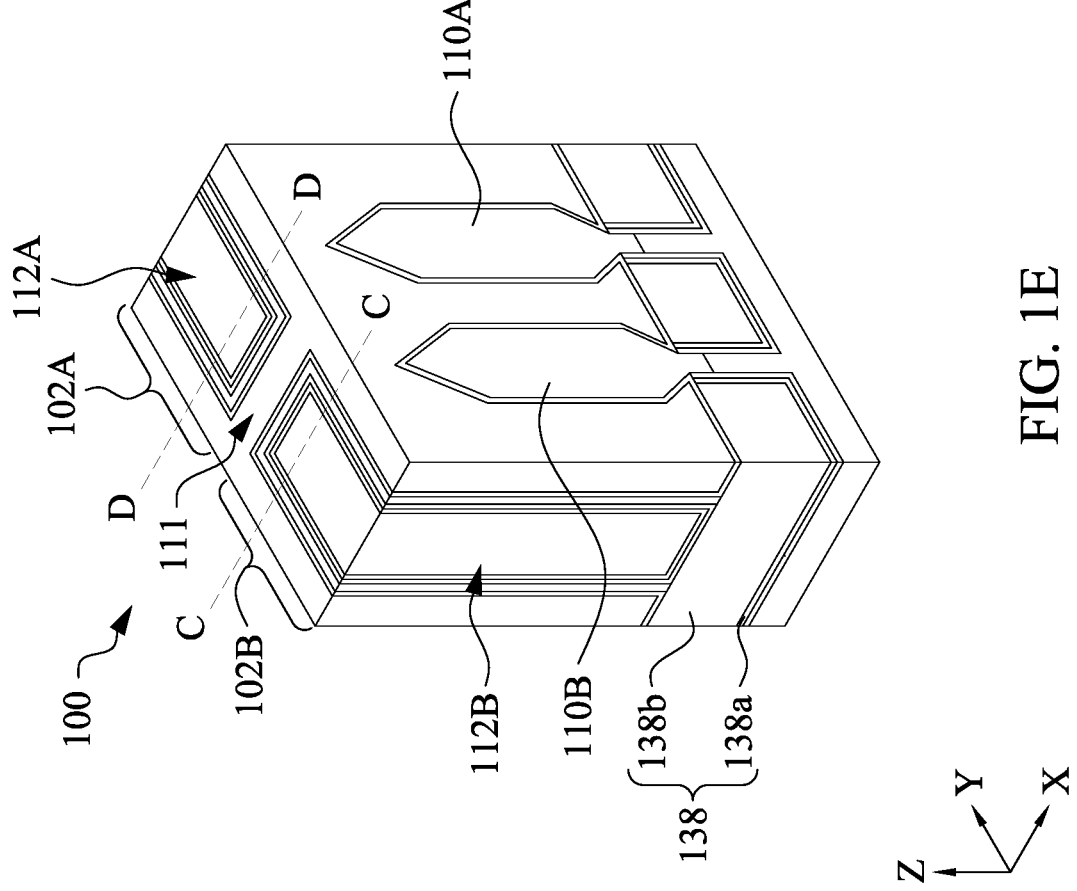
FIGS. 1E and 1F-1G illustrate an isometric view and cross-sectional views of a semiconductor device with passivation layers, respectively, in accordance with some embodiments.
Figure 1G:
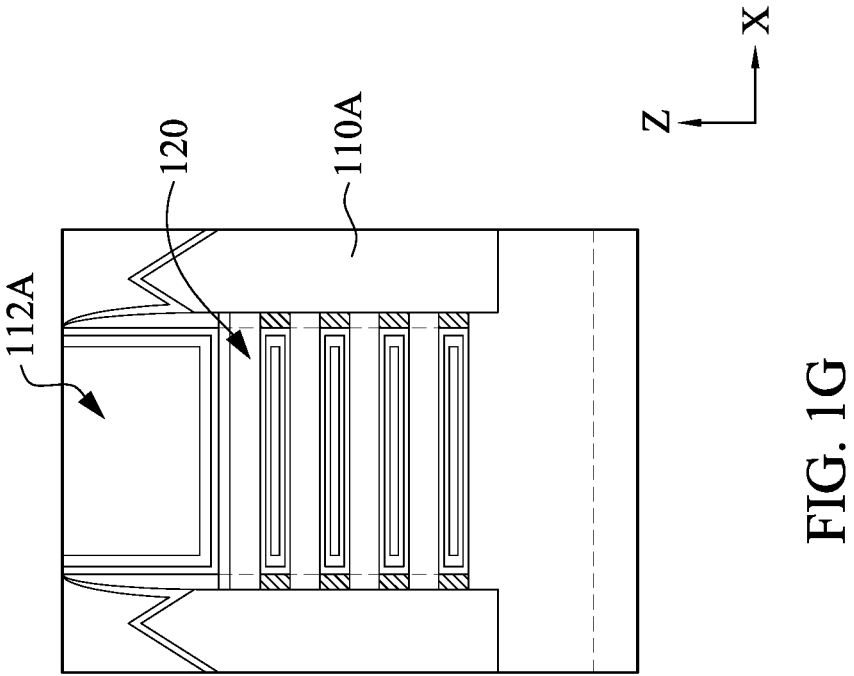
Figure 1F:
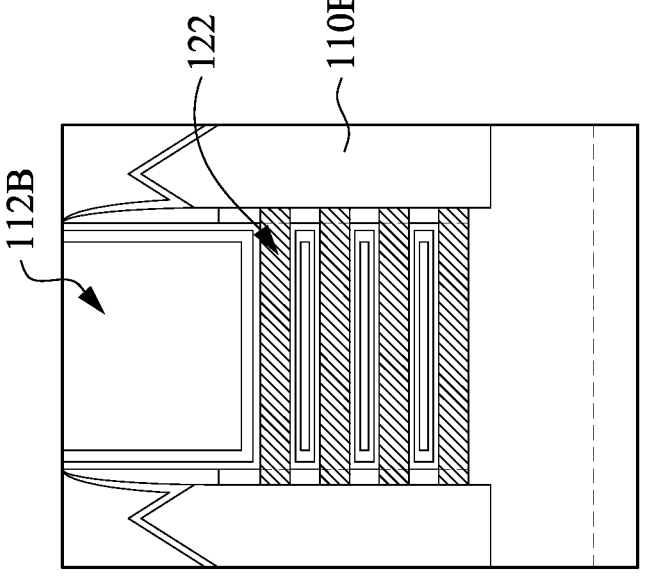

Referring to FIGS. 1A and 1C-1D, epitaxial fin regions 110A-110B can be grown on regions of fin top portions 108A2-108B2 that are not under gate structures 112A-112B, respectively. In some embodiment, as shown in FIGS. 1E-1G, epitaxial fin regions 110B-110A can be epitaxially grown on fin base portions 108B1-108A1 after removing fin top portions 108B2-108A2 that are not under gate structures 112B-112A. Epitaxial fin regions 110A-110B can include epitaxially-grown semiconductor materials similar to or different from each other. In some embodiments, the epitaxially-grown semiconductor material can include the same material or a different material from the material of substrate 106. Epitaxial fin regions 110A-110B can each have a thickness along side surfaces of fin top portions 108A2-108B2 ranging from about 3 nm to about 6 nm. Though triangular cross-sections of epitaxial fin regions 110A-110B are shown in FIGS. 1C-1D, epitaxial fin regions 110A-110B can have cross-sections of other geometric shapes (e.g., rectangular, semicircular, or polygonal).

Epitaxial fin regions 110A-110B can be p-type or n-type for PFETs 102A-102B or NFETs 102A-102B, respectively. In some embodiments, epitaxial fin regions 110A-110B of respective FETs 102A-102B can be the same or opposite doping type with respect to each other.

P-type epitaxial fin regions 110A-110B can include SiGe, SiGeB, GeB, SiGeSnB, a III-V semiconductor compound, or a combination thereof and a dopant concentration ranging from about $1 \times 10^{20}$ atoms/cm$^3$ to about $1 \times 10^{21}$ atoms/cm$^3$. In some embodiments, each of p-type epitaxial fin regions 110A-110B can have a plurality of sub-regions (not shown) that can include SiGe and can differ from each other based on, for example, doping concentration, epitaxial growth process conditions, and/or relative concentration of Ge with respect to Si. Each of the sub-regions can have thicknesses similar to or different from each other and thicknesses can range from about 0.5 nm to about 5 nm. In some embodiments, the atomic percent Ge in the sub-region closest to fin top portions 108A2-108B2 can be smaller than the atomic percent Ge in the sub-region farthest from fin top portions 108A2-108B2. In some embodiments, the sub-region closest to fin top portions 108A2-108B2 can include Ge in a range from about 15 atomic percent to about 35 atomic percent, while the sub-region farthest from fin top portions 108A2-108B2 can include Ge in a range from about 25 atomic percent to about 50 atomic percent with any remaining atomic percent being Si in the sub-regions.

The plurality of sub-regions of p-type epitaxial fin regions 110A-110B can have varying p-type dopant concentrations with respect to each other, according to some embodiments. For example, the sub-region closest to fin top portions 108A2-108B2 can be undoped or can have a dopant concentration lower (e.g., dopant concentration less than about $8 \times 10^{20}$ atoms/cm³) than the dopant concentration (e.g., dopant concentration in a range from about $1 \times 10^{20}$ to about $3 \times 10^{22}$ atoms/cm³) of the sub-region farthest from fin top portions 108A2-108B2.

In some embodiments, n-type epitaxial fin regions 110A-110B can have a plurality of n-type sub-regions (not shown). First n-type sub-regions closest to fin top portions 108A2-108B2 can have materials with SiAs, SiC, or SiCP, a dopant concentration ranging from about $1 \times 10^{20}$ atoms/cm³ to about $1 \times 10^{20}$ atoms/cm³, and a thickness ranging from about 1 nm to about 3 nm. Second n-type sub-regions disposed on the first n-type sub-regions can have materials with SiP and a dopant concentration ranging from about $1 \times 10^{20}$ atoms/cm³ to about $1 \times 10^{22}$ atoms/cm³. Third n-type sub-regions disposed on the second n-type sub-regions can have materials with material compositions and thicknesses similar to the first n-type sub-regions. Other materials, thicknesses, and dopant concentrations for the plurality of n-type and/or p-type sub-regions are within the scope and spirit of this disclosure.

Epitaxial fin regions 110A-110B along with their underlying first fin regions 120A and 122A can form source/drain (S/D) regions of FETs 102A-102B. Nanostructured channel regions 120B and 122B can be interposed between a pair of S/D regions of FETs 102A-102B, respectively, as shown in FIGS. 1C-1D.

Referring to FIGS. 1B-1D, gate structures 112A-112B can be multi-layered structures and can be disposed on regions of top surface and sidewalls of fin top portions 108A2-108B2 not covered by epitaxial fin regions 110A-110B. In some embodiments, each of nanostructured channel regions 120B and 122B can be wrapped around gate structures 112A-112B, respectively, or one or more layers of gate structures 112A-112B, respectively, for which gate structures 112A-112B can be referred to as gate-all-around (GAA) structures or horizontal gate-all-around (HGAA) structures, and FETs 102A-102B can be referred to as GAA FETs 102A-102B. Spacing 111 between gate structures 112A-112B is not drawn to scale and gate structures 112A-112B can be separated from each other by any distance. In some embodiments, FETs 102A-102B can have a common gate structure disposed on fin top portions 108A2-108B2 similar to gate structures 112A-112B.

Gate structures 112A-112B can include gate dielectric layers 128A-128B, gate work function metal layers 130A-130B, and gate metal fill layers 132A-132B, respectively. As shown in FIG. 1B, gate dielectric layer 128A can be wrapped around each of nanostructured channel regions 120B to fill the spaces between adjacent nanostructured channel regions 120B, and thus electrically isolate nanostructured channel regions 120B from each other and from conductive gate work function metal layer 130A and gate metal fill layer 132A to prevent shorting between gate structure 112A and S/D regions of FET 102A during its operation. Similarly, gate dielectric layer 128B can be wrapped around each of nanostructured channel regions 122B to fill the spaces between adjacent nanostructured channel regions 122B and electrically isolate nanostructured channel regions 122B from each other and from conductive gate work function metal layer 130B and gate metal fill layer 132B to prevent shorting between gate structure 112B and S/D regions of FET 102B during its operation.

Each of gate dielectric layers 128A-128B can have a thickness ranging from about 1 nm to about 5 nm and can include (i) a layer of silicon oxide, silicon nitride, and/or silicon oxynitride, (ii) a high-k dielectric material, such as hafnium oxide ($HfO_2$), titanium oxide ($TiO_2$), hafnium zirconium oxide (HfZrO), tantalum oxide ($Ta_2O_3$), hafnium silicate ($HfSiO_4$), zirconium oxide ($ZrO_2$), zirconium silicate ($ZrSiO_2$), (iii) a high-k dielectric material having oxides of lithium (Li), beryllium (Be), magnesium (Mg), calcium (Ca), strontium (Sr), scandium (Sc), yttrium (Y), zirconium (Zr), aluminum (Al), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu), or (iv) a combination thereof.

As shown in FIG. 1B, one or more of nanostructured channel regions 120B and 122B can be wrapped around work function layers metal 130A-130B and gate metal fill layers 132A-132B. Gate work function metal layers 130A-130B can include a single metal layer or a stack of metal layers. The stack of metal layers can include metals having work function values equal to or different from each other. In some embodiments, each of gate work function metal layers 130A-130B can include aluminum (Al), copper (Cu), tungsten (W), titanium (Ti), tantalum (Ta), titanium nitride (TiN), tantalum nitride (TaN), nickel silicide (NiSi), cobalt silicide (CoSi), silver (Ag), tantalum carbide (TaC), tantalum silicon nitride (TaSiN), tantalum carbon nitride (TaCN), titanium aluminum (TiAl), titanium aluminum nitride (TiAlN), tungsten nitride (WN), metal alloys, and/or combinations thereof. In some embodiments, each gate work function layer 130 can include Al-doped metal, such as Al-doped Ti, Al-doped TiN, Al-doped Ta, or Al-doped TaN. In some embodiments, each gate work function layer 130 can have a thickness ranging from about 2 nm to about 15 nm.

In some embodiments, gate barrier layers (not shown) can be disposed between gate dielectric layers 128A-128B and gate work function metal layers 130A-130B, respectively. Gate barrier layers can serve as nucleation layers for subsequent formation of gate work function layers 130A-130B and/or can help to prevent substantial diffusion of metals (e.g., Al) from gate work function layers 130A-130B to underlying layers (e.g., gate dielectric layers 128A-128B). Gate barrier layers can include titanium (Ti), tantalum (Ta), titanium nitride (TiN), tantalum nitride (TaN), or other suitable diffusion barrier materials. In some embodiments, gate barrier layers can include substantially fluorine-free metal or metal-containing films. The substantially fluorine-free metal or fluorine-free metal-containing film can include an amount of fluorine contaminants less than 5 atomic percent in the form of ions, atoms, and/or molecules. In some embodiments, gate barrier layers can have a thickness ranging from about 1 nm to about 10 nm.

Each of gate metal fill layers 132A-132B can include a single metal layer or a stack of metal layers. The stack of metal layers can include metals different from each other. In some embodiments, each of gate metal fill layers 132A-132B can include a suitable conductive material, such as Ti, silver (Ag), Al, titanium aluminum nitride (TiAlN), tantalum carbide (TaC), tantalum carbo-nitride (TaCN), tantalum silicon nitride (TaSiN), manganese (Mn), Zr, titanium nitride (TiN), tantalum nitride (TaN), ruthenium (Ru), molybdenum (Mo), tungsten nitride (WN), copper (Cu), tungsten (W), cobalt (Co), nickel (Ni), titanium carbide (TiC), titanium aluminum carbide (TiAlC), tantalum aluminum carbide (TaAlC), metal alloys, and/or combinations thereof. Though gate structures 112A-112B are shown to be similar, FETs 102A-102B can have gate structures with materials and/or electrical properties (e.g., threshold voltage, work function value) different from each other. Also, though gate structures 112A-112B are shown to have horizontal GAA structures, other gate structures (e.g., vertical GAA structures or gate structures without GAA structures) are within the scope and spirit of this disclosure.

Spacers 114A-114B can be disposed on respective passivation layers 109A-109B and can form sidewalls of respective gate structures 112A-112B and be in physical contact with gate dielectric layers 128A-128B, according to some embodiments. Spacers 114A-114B can include an insulating material, such as silicon oxide, silicon nitride, silicon carbon nitride (SiCN), silicon oxycarbon nitride (SiOCN), a low-k material, or a combination thereof. Spacers 114A-114B can have a low-k material with a dielectric constant less than about 3.9 (e.g., about 3.5, about 3.0, or about 2.8). In some embodiments, each of spacers 114A-114B can have a thickness ranging from about 2 nm to about 10 nm.

FETs 102A-102B can be incorporated into an integrated circuit through the use of other structural components, such as gate contact structures, S/D contact structures, conductive vias, conductive lines, interconnect metal layers, etc., which are not shown here for the sake of clarity.

Referring to FIGS. 1A-1D, semiconductor device 100 can further include etch stop layer (ESL) 116, interlayer dielectric (ILD) layer 118, and shallow trench isolation (STI) regions 138. ESL 116 can be configured to protect gate structures 112A-112B and/or epitaxial fin regions 110A-110B. This protection can be provided, for example, during the formation of ILD layer 118 and/or S/D contact structures (not shown). ESL 116 can be disposed on sidewalls of spacers 114A-114B and on epitaxial regions 110A-110B. In some embodiments, ESL 116 can include, for example, silicon nitride (SiN$_x$), silicon oxide (SiO$_x$), silicon oxynitride (SiON), silicon carbide (SiC), silicon carbo-nitride (SiCN), boron nitride (BN), silicon boron nitride (SiBN), silicon carbon boron nitride (SiCBN), or a combination thereof. In some embodiments, ESL 116 can have a thickness ranging from about 3 nm to about 30 nm.

ILD layer 118 can be disposed on ESL 116 and can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). In some embodiments, the dielectric material is silicon oxide. In some embodiments, ILD layer 118 can have a thickness in a range from about 50 nm to about 200 nm.

STI regions 138 can be configured to provide electrical isolation between FETs 102A-102B and neighboring FETs (not shown) on substrate 106 and/or neighboring active and passive elements (not shown) integrated with or deposited on substrate 106. In some embodiments, STI regions 138 can include a plurality of layers, such as a nitride layer and/or an oxide layer 138A and an insulating layer 138B disposed on nitride and/or oxide layers 138A. In some embodiments, the nitride and/or oxide layers 138A can prevent oxidation of the sidewalls of fin top portions 108A2-108B2 during the formation of STI regions 138. In some embodiments, insulating layer 138B can include silicon oxide, silicon nitride, silicon oxynitride, fluorine-doped silicate glass (FSG), a low-k dielectric material, and/or other suitable insulating materials. In some embodiments, STI regions 138 can have a vertical dimension along a Z-axis ranging from about 40 nm to about 200 nm.

Based on the disclosure herein, it will be recognized that cross-sectional shapes of semiconductor device 100 and its elements (e.g., fin structure 108A-108B, gate structures 112A-112B, epitaxial fin regions 110A-110B, spacers 114A-114B, and/or STI regions 138) are illustrative and are not intended to be limiting.

FIGS. 2A-2F illustrate cross-sectional views of FETs 102A-102B along line B-B of FIG. 1A for different configurations of channel regions with passivation layers 109A-109B, respectively. In addition, FIGS. 2A-2F illustrate regions of fin top portions 108A2-108B2 forming the channel regions with passivation layers 109A-109B under gate structures 112A-112B, which are not shown for the sake of clarity. The above discussion of FETs 102A-102B with respect to FIGS. 1A-1D applies to FETs 102A-102B of FIGS. 2A-2F, unless mentioned otherwise.

Figures 2C, 2D:
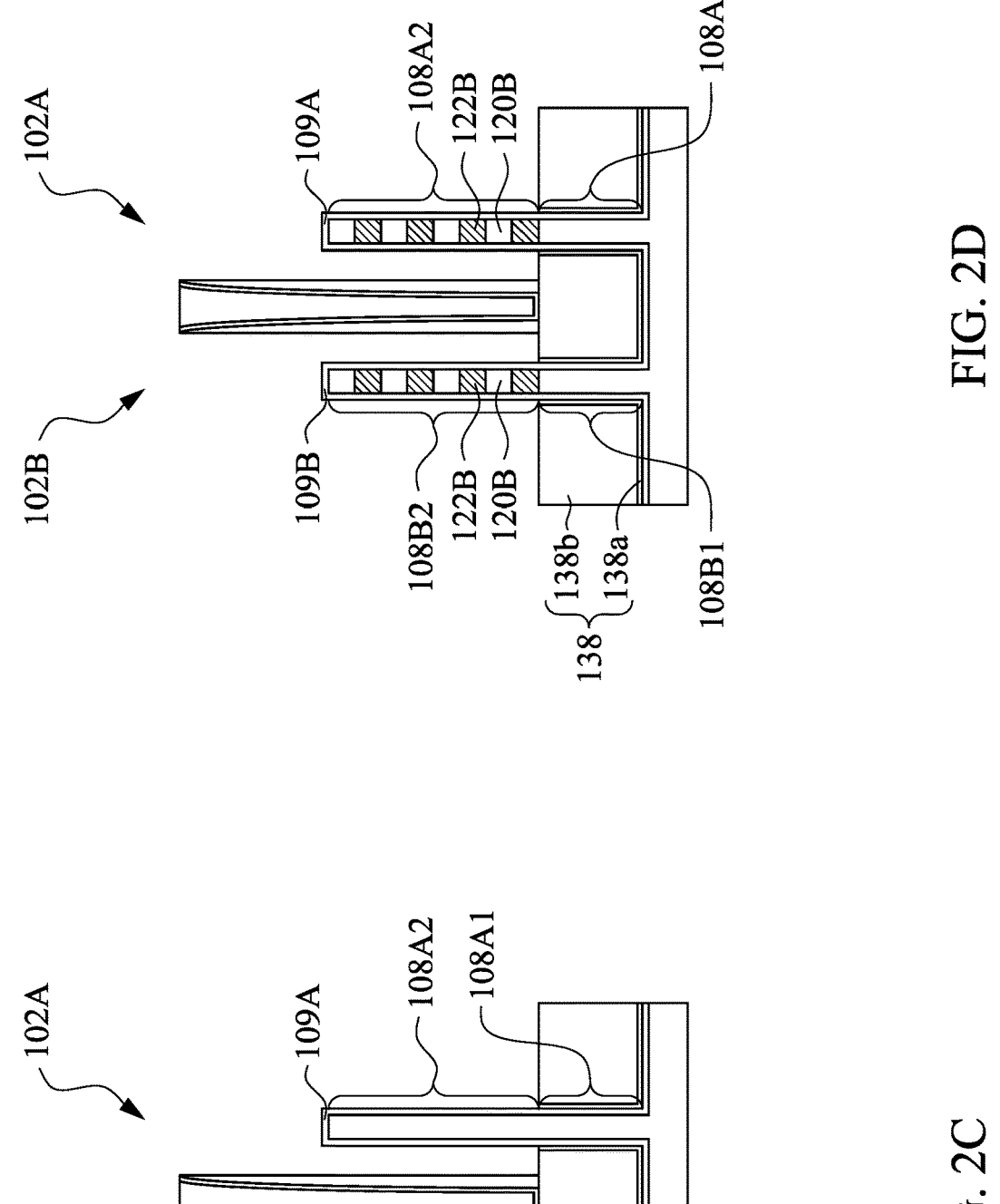
Figures 2E, 2F:
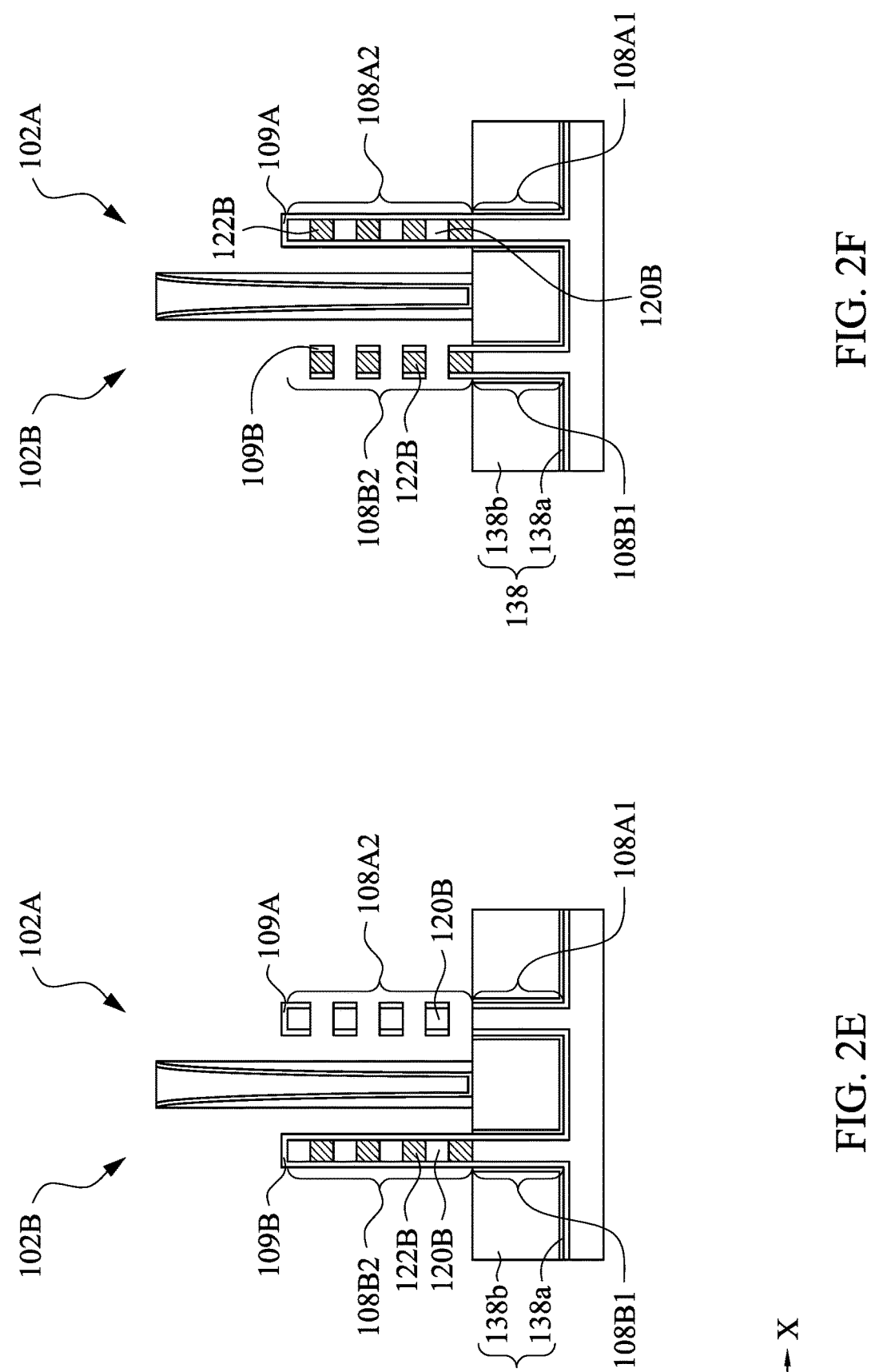
Figures 2G, 2H:
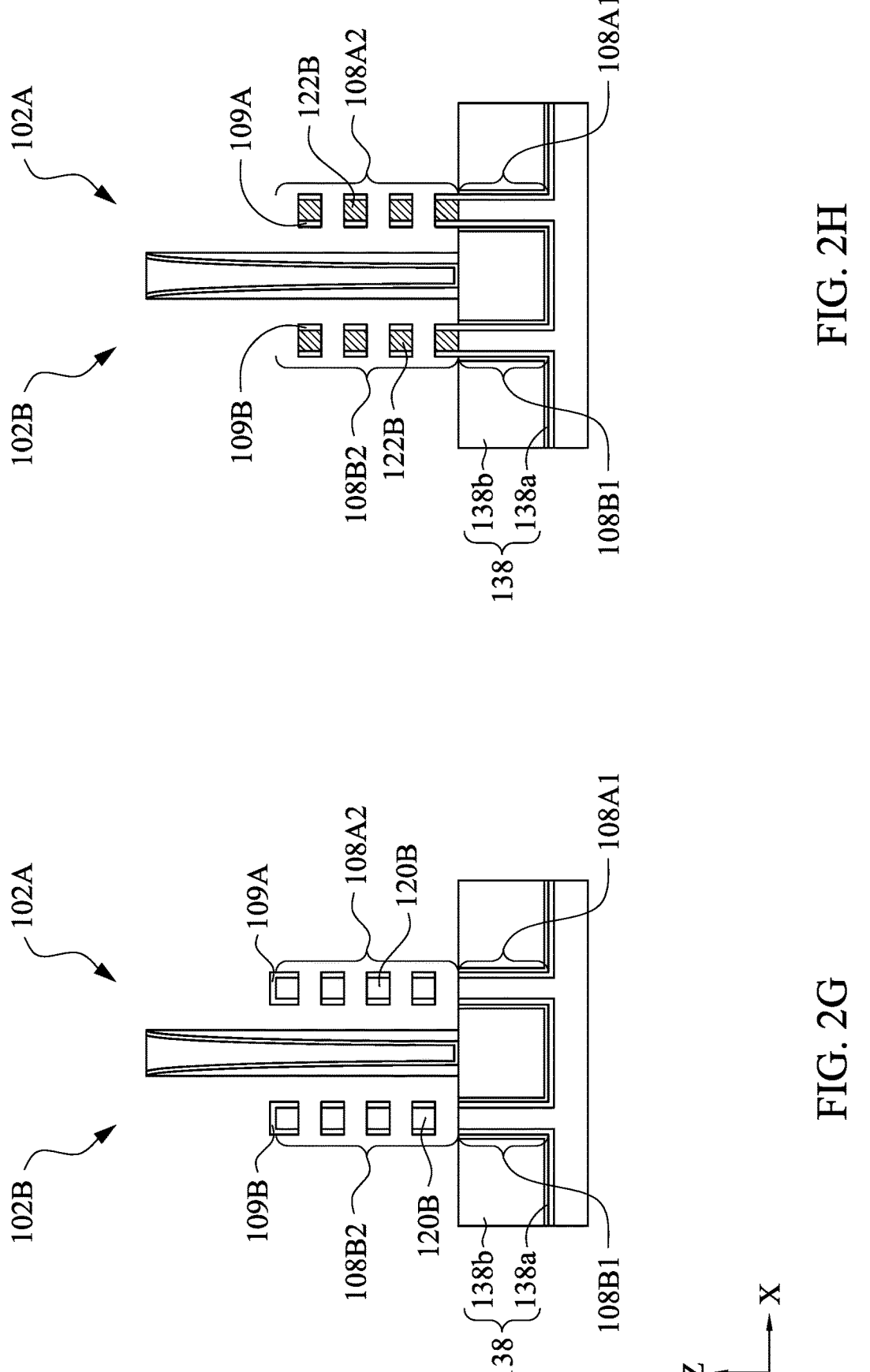

In some embodiments, instead of nanostructured channel regions 120B and 122B of FIG. 1B, the channel regions of FETs 102A-102B can each include a single fin structure (FIG. 2A) etched from substrate 106 or can be an epitaxially grown fin structure (FIG. 2B) grown on respective fin base portions 108A1-108B1. Instead of the channel regions of both FETs 102A-102B being formed in etched fin structures like FIG. 2A or epitaxial fin structures of FIG. 2B, the channel region of one FET (e.g., FET 102A) can include the etched fin structure and the channel region of the other FET (e.g., FET 102B) can include the epitaxial fin structure, as shown in FIG. 2C. In some embodiments, the channel regions of FETs 102A-102B can each include a stacked layer of second fin regions 120B and 122B, as shown in FIG. 2D. In some embodiments, as shown in FIGS. 2E-2F, the channel region of one of FETs 102A-102B can include the stacked layer of second fin regions 120B and 122B, as shown in FIGS. 2E-2F, while the channel region of the other of FETs 102A-102B can include nanostructured channel regions 120B or 122B. In some embodiments, instead of having different nanostructured channel regions 120B and 122B in FETs 102A-102B as in FIG. 1B, both FETs 102A-102B can have nanostructured channel regions 120B as in FIG. 2G or nanostructured channel regions 122B as in FIG. 2H.

FIG. 3 is a flow diagram of an example method 300 for fabricating semiconductor device 100, according to some embodiments. For illustrative purposes, the operations illustrated in FIG. 300 will be described with reference to the example fabrication process for fabricating semiconductor device 300 as illustrated in FIGS. 4A-13A and 4B-13B. FIGS. 4A-13A are isometric views of semiconductor device 100 at various stages of its fabrication. FIGS. 4B-13B are cross-sectional views along lines B-B of structures of FIGS. 4A-13A, respectively, according to some embodiments. Operations can be performed in a different order or not performed depending on specific applications. It should be noted that method 300 may not produce a complete semiconductor device 100. Accordingly, it is understood that additional processes can be provided before, during, and after method 300, and that some other processes may only be briefly described herein. Elements in FIGS. 4A-13A and 4B-13B with the same annotations as elements in FIGS. 1A-1D are described above.

Figure 4B:
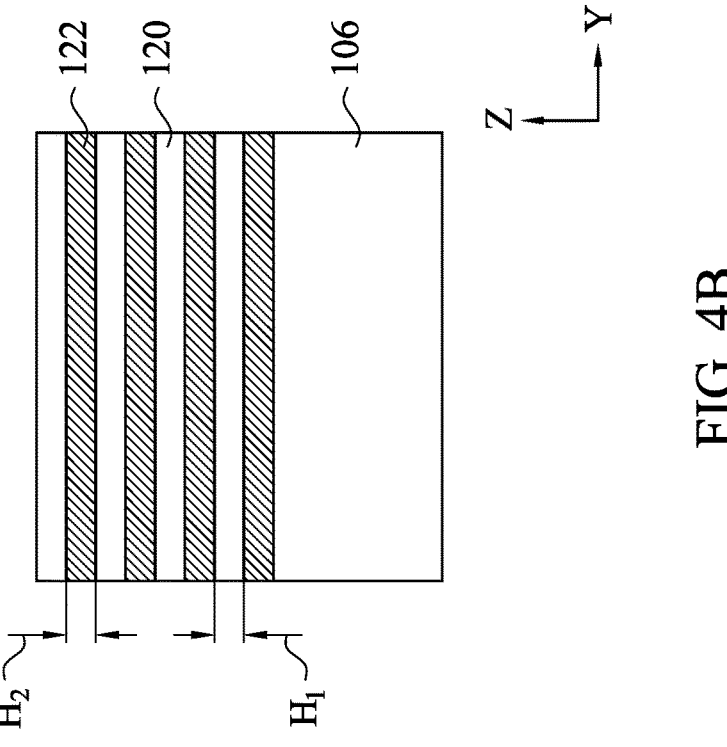
Figure 4A:
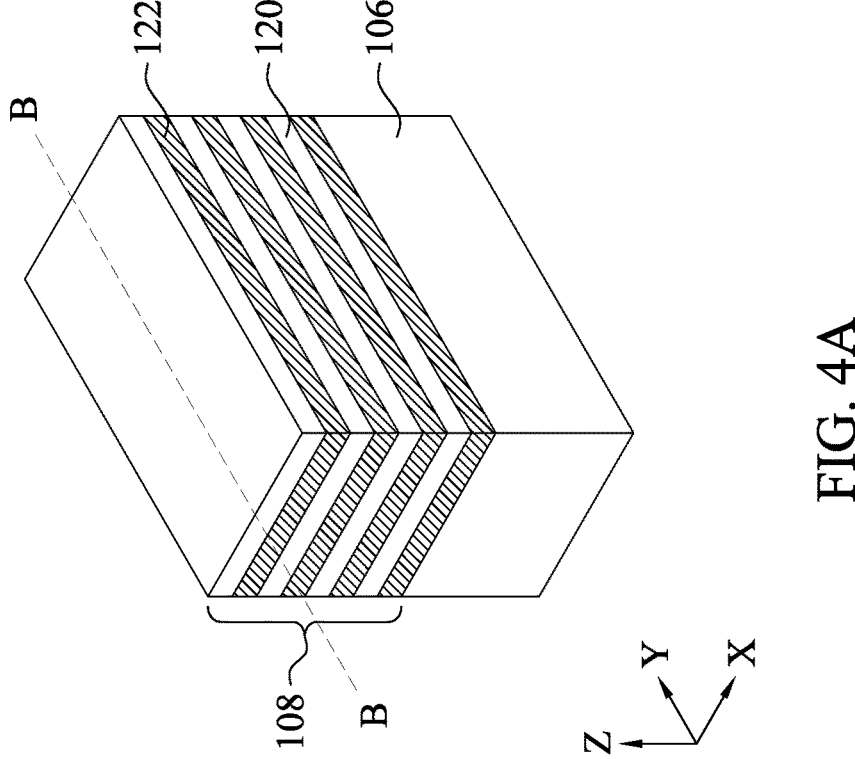

In operation 305, fin structures are formed on a substrate. For example, fin structures 108A-108B (shown in FIGS. 5A-5B) with fin base portions 108A1-108B1 and fin top portions 108A2-108B2 can be formed on substrate 106 as described with reference to FIGS. 4A-5B. The process for forming fin structures 108A-108B can include forming a stacked layer 108* on substrate 106 as shown in FIGS. 4A-4B. Stacked layer 108* can include first and second semiconductor layers 120* and 122* stacked in an alternating configuration. First and second semiconductor layers 120* and 122* can have respective vertical dimensions $H_1$ and $H_2$ along a Z-axis ranging from about 5 nm to about 30 nm.

Each of first and second semiconductor layers 120* and 122* can be epitaxially grown on its underlying layer and can include semiconductor materials different from each other. In some embodiments, first and second semiconductor layers 120* and 122* can include semiconductor materials with oxidation rates and/or etch selectivity different from each other. In some embodiments, first and second semiconductor layers 120* and 122* can include semiconductor materials similar to or different from substrate 106. First and second semiconductor layers 120* and 122* can include (i) an elementary semiconductor, such as silicon or germanium; (ii) a compound semiconductor including a III-V semiconductor material; (iii) an alloy semiconductor including SiGe, germanium stannum, or silicon germanium stannum; or (iv) a combination thereof. In some embodiments, first semiconductor layers 120* can include Si and second semiconductor layers 122* can include SiGe. In some embodiments, first and second semiconductor layers 120* and 122* can include SiGe with Ge in a range from about 25 atomic percent to about 50 atomic percent with any remaining atomic percent being Si or can include Si without any substantial amount of Ge.

First and/or second semiconductor layers 120* and 122* can be undoped or can be in-situ doped during their epitaxial growth process using (i) p-type dopants, such as boron, indium, or gallium; and/or (ii) n-type dopants, such as phosphorus or arsenic. For p-type in-situ doping, p-type doping precursors, such as diborane ($B_2H_6$), boron trifluoride ($BF_3$), and/or other p-type doping precursors can be used. For n-type in-situ doping, n-type doping precursors, such as phosphine ($PH_3$), arsine ($AsH_3$), and/or other n-type doping precursor can be used.

The process for forming fin structures 108A-108B can further include etching the structure of FIG. 4A through patterned hard mask layers (not shown) formed on stacked layer 108* of FIG. 4A. In some embodiments, hard mask layers can include layers of silicon oxide formed, for example, using a thermal oxidation process and/or layers of silicon nitride formed using, for example, low pressure chemical vapor deposition (LPCVD) or plasma enhanced CVD (PECVD). The etching of the structure of FIG. 4A can include a dry etch, a wet etch process, or a combination thereof.

The dry etch process can include using etchants having an oxygen-containing gas, a fluorine-containing gas (e.g., $CF_4$, $SF_6$, $CH_2F_2$, $CHF_3$, $NF_3$, and/or $C_2F_6$), a chlorine-containing gas (e.g., $Cl_2$, $CHCl_3$, $CCl_4$, HCl, and/or $BCl_3$), a bromine-containing gas (e.g., HBr and/or $CHBR_3$), ammonia gas ($NH_3$), an iodine-containing gas, other suitable etching gases and/or plasmas, or combinations thereof. The dry etch process can be carried out at high bias voltage ranging from about 150 V to about 350 V, at a radio frequency power ranging from about 10 W to about 50 W, at a pressure of about 5 Torr to about 50 Torr, at a temperature ranging from about 25° C. to about 40° C., and for a time period ranging from about 10 sec to about 40 sec.

The wet etch process can include etching in diluted hydrofluoric acid (DHF), potassium hydroxide (KOH) solution, ammonia ($NH_3$), a solution containing hydrofluoric acid (HF), nitric acid ($HNO_3$), acetic acid ($CH_3COOH$), or combinations thereof.

Figure 5B:
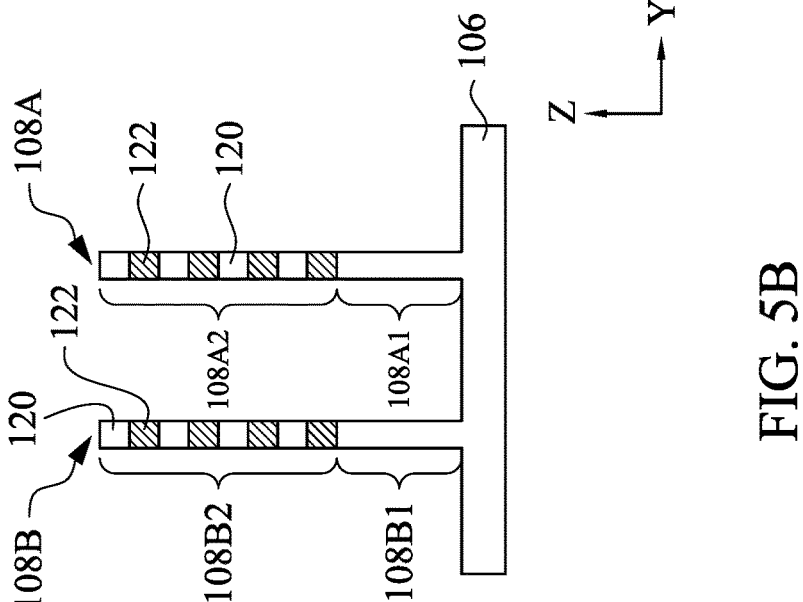
Figure 5A:
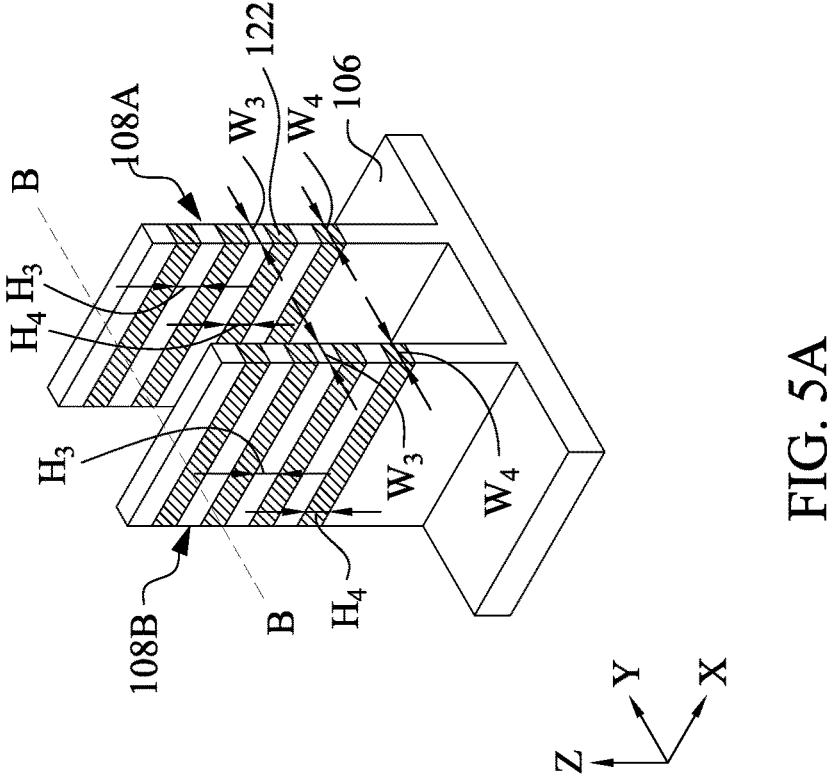

After the etching of stacked layer 108*, fin structures 108A-108B with fin base portions 108A1-108B1 and fin top portions 108A2-108B2 having respective vertical dimensions along a Z-axis ranging from about 40 nm to about 60 nm can be formed, as shown in FIGS. 5A-5B. First and second semiconductor layers 120 and 122 formed in fin top portions 108A2-108B2 can have respective vertical dimensions $H_3$ and $H_4$ along a Z-axis ranging from about 5 nm to about 30 nm and respective horizontal dimensions $W_3$ and $W_4$ along a Y-axis ranging from about 5 nm to about 50 nm. The ratios of $H_1/W_1$ and $H_2/W_2$ can range from about 0.2 to about 5. In some embodiments, dimensions $H_3$ and $H_4$ and $W_3$ and $W_4$ can be equal to or different from each other, respectively. In some embodiments, the ratios of $H_1/W_1$ and $H_2/W_2$ can be equal to or different from each other, respectively.

Referring to FIG. 3, in operation 310, passivation layers are formed on the fin structures. For example, passivation layers 109A-109B can be formed on fin structures 108A-108B, respectively, as described with reference to FIGS. 6A-6B. The process for forming passivation layers 109A-109B on fin structures 108A-108B can include blanket depositing a passivation layer 109 on the structure of FIG. 5A using one or more precursor gases having fluorine, chlorine, nitrogen, oxygen, hydrogen, deuterium, $NH_3$, and/or hydrogen sulfide ($H_2S$) in an ALD or CVD process. The one or more precursor gases can have a flow rate ranging from about 10 sccm to about 1500 sccm during the blanket deposition process. The blanket deposition process can be carried out at a pressure of about 10 Torr to about 20 atmospheric pressure, at a temperature ranging from about 100° C. to about 300° C., and for a time period ranging from about 10 sec to about 120 min. The portions of blanket deposited passivation layer 109 on fin structures 108A-108B can be referred to as passivation layers 109A-109B, respectively.

Referring to FIG. 3, in operation 315, STI regions are formed on the passivation layers. For example, STI regions 138 can be formed on passivation layers 109A-109B, as described with reference to FIGS. 7A-7B. The formation of STI regions 138 can include (i) depositing a layer of nitride material (not shown) on the structure of FIG. 6A, (ii) depositing a layer of oxide material (not shown) on the layer of nitride material, (iii) depositing a layer of insulating material (not shown) on the layer of oxide material, (iv) annealing the layer of insulating material, (v) chemical mechanical polishing (CMP) the layers of nitride and oxide materials and the annealed layer of insulating material, and (vi) etching back the polished structure to form STI regions 138 of FIG. 7A.

The layers of nitride and oxide materials can be deposited using a suitable process for depositing oxide and nitride materials, such as ALD or CVD. These layers of oxide and nitride materials can prevent oxidation of the sidewalls of fin top portions 108A2-108B2 during the deposition and annealing of the insulating material.

In some embodiments, the layer of insulating material can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane (SiH4) and oxygen ($O_2$) as reacting precursors. In some embodiments, layer of insulating material can be formed using a sub-atmospheric CVD (SACVD) process or high aspect-ratio process (HARP), where process gases can include tetraethoxysilane (TEOS) and/or ozone ($O_3$).

In some embodiments, the layer of insulating material can be formed by depositing flowable silicon oxide using a flowable CVD (FCVD) process. The FCVD process can be followed by a wet anneal process. The wet anneal process can include annealing the deposited layer of insulating material in steam at a temperature in a range from about 200° C. to about 700° C. for a period in a range from about 30 min to about 120 min. The wet anneal process can be followed by the CMP process to remove portions of the layers of nitride, oxide, and insulating materials to substantially coplanarize top surfaces of the layers of nitride, oxide, and insulating materials with top surfaces of fin structures 108A-108B. The CMP process can be followed by the etching process to etch back the layers of nitride, oxide, and insulating materials to form STI regions 138 of FIG. 7A.

The etch back of the layers of nitride, oxide, and insulating materials can be performed by a dry etch process, a wet etch process, or a combination thereof. In some embodiments, the dry etch process can include using a plasma dry etch with a gas mixture having octafluorocyclobutane ($C_4F_8$), argon (Ar), oxygen ($O_2$), and helium (He), fluoroform ($CHF_3$) and He, carbon tetrafluoride ($CF_4$), difluoromethane ($CH_2F_2$), chlorine ($Cl_2$), and $O_2$, hydrogen bromide (HBr), $O_2$, and He, or a combination thereof with a pressure ranging from about 1 mTorr to about 5 mTorr. In some embodiments, the wet etch process can include using a diluted hydrofluoric acid (DHF) treatment, an ammonium peroxide mixture (APM), a sulfuric peroxide mixture (SPM), hot deionized water (DI water), or a combination thereof. In some embodiments, the wet etch process can include using ammonia ($NH_3$) and hydrofluoric acid (HF) as etchants and inert gases, such as Ar, xenon (Xe), He, or a combination thereof. In some embodiments, the flow rate of HF and $NH_3$ used in the wet etch process can each range from about 10 sccm to about 100 sccm. In some embodiments, the wet etch process can be performed at a pressure ranging from about 5 mTorr to about 100 mTorr and a high temperature ranging from about 50° C. to about 120° C.

Referring to FIG. 3, in operation 320, protective oxide layers are formed on the passivation layers and polysilicon structures are formed on the protective oxide layers and the STI regions. For example, protective oxide layers 740A-740B can be formed on respective passivation layers 109A-109B and polysilicon structures 112A*-112B* can be formed on respective protective oxide layer 740A-740B and STI regions 138, as described with reference to FIGS. 7A-7B.

Figure 6B:
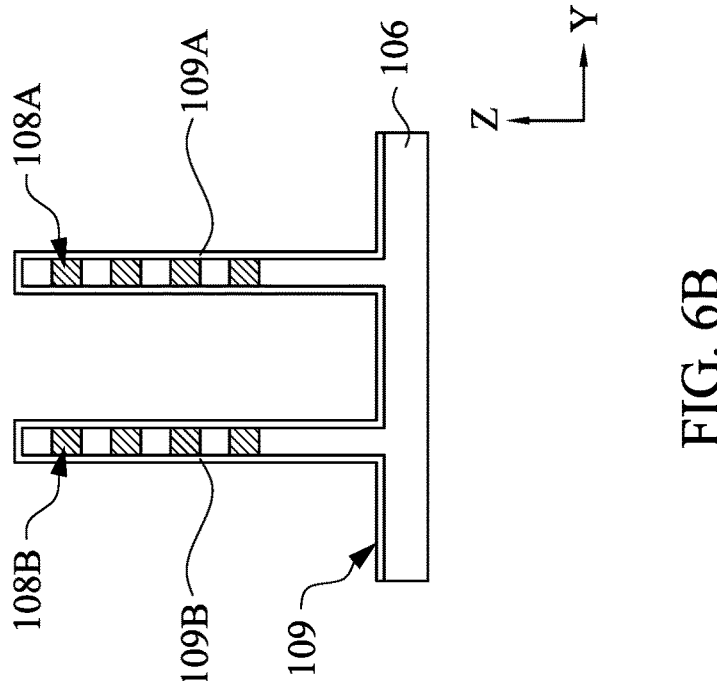
Figure 6A:
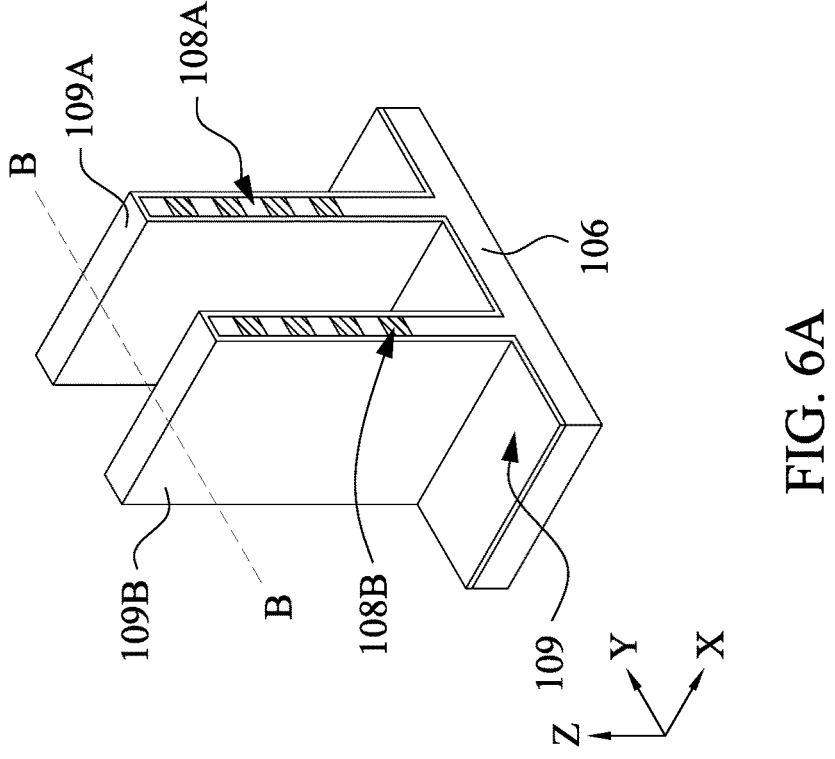

The process for forming protective oxide layers 740A-740B can include blanket depositing a layer of oxide material (not shown) on the structure of FIG. 6A followed by a high temperature annealing process and an etching process. The layer of oxide material can include silicon oxide and can be blanket deposited using a suitable deposition process, such as CVD, ALD, plasma enhanced ALD (PEALD), physical vapor deposition (PVD), or e-beam evaporation. In some embodiments, the layer of oxide material can be blanket deposited using PEALD at an energy ranging from about 400 W to about 500 W and at a temperature ranging from about 300° C. to about 500° C. The blanket deposition of the layer of oxide material can be followed by a dry annealing process under oxygen gas flow at a temperature ranging from about 800° C. to about 1050° C. The oxygen precursor concentration can be in a range of about 0.5% to about 5% of the total gas flow rate. In some embodiments, the annealing process can be a flash process where the annealing time can be between about 0.5 s to about 5 s. The etching process to form protective oxide layers 740A-740B may not follow the annealing process and can be carried out during the formation of polysilicon structures 112A*-112B* described below or as a separate etching process after the formation of polysilicon structures 112A*-112B*.

Figure 7B:
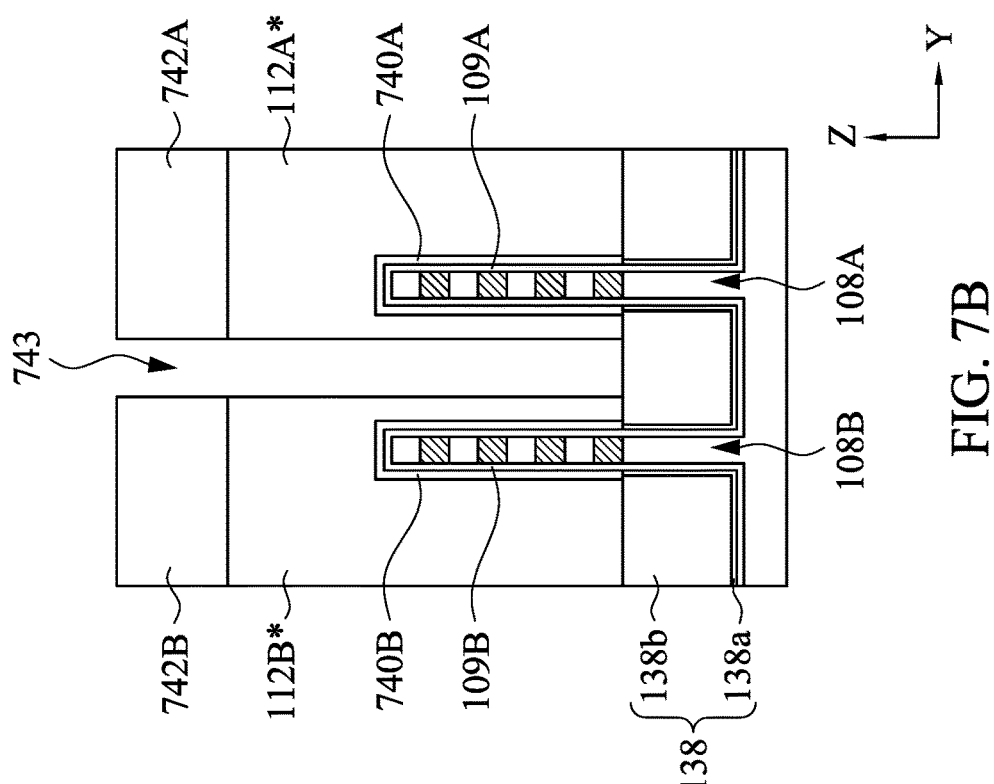
Figure 7A:
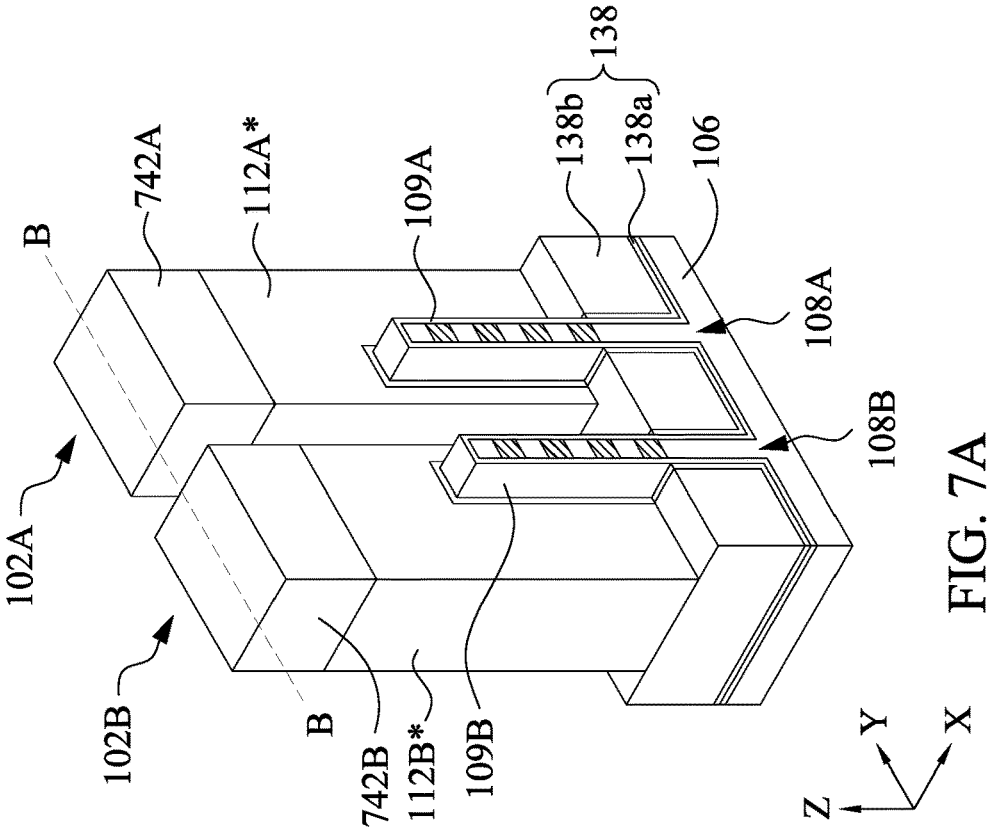
Figure 8B:
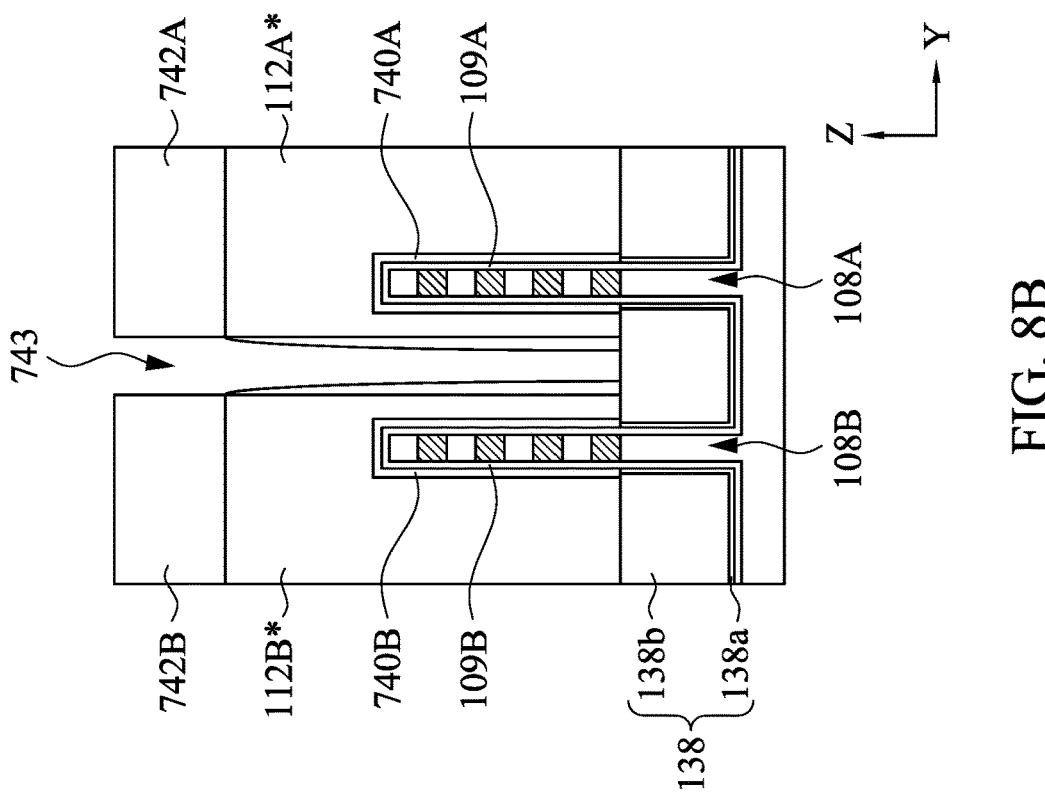
Figure 8A:
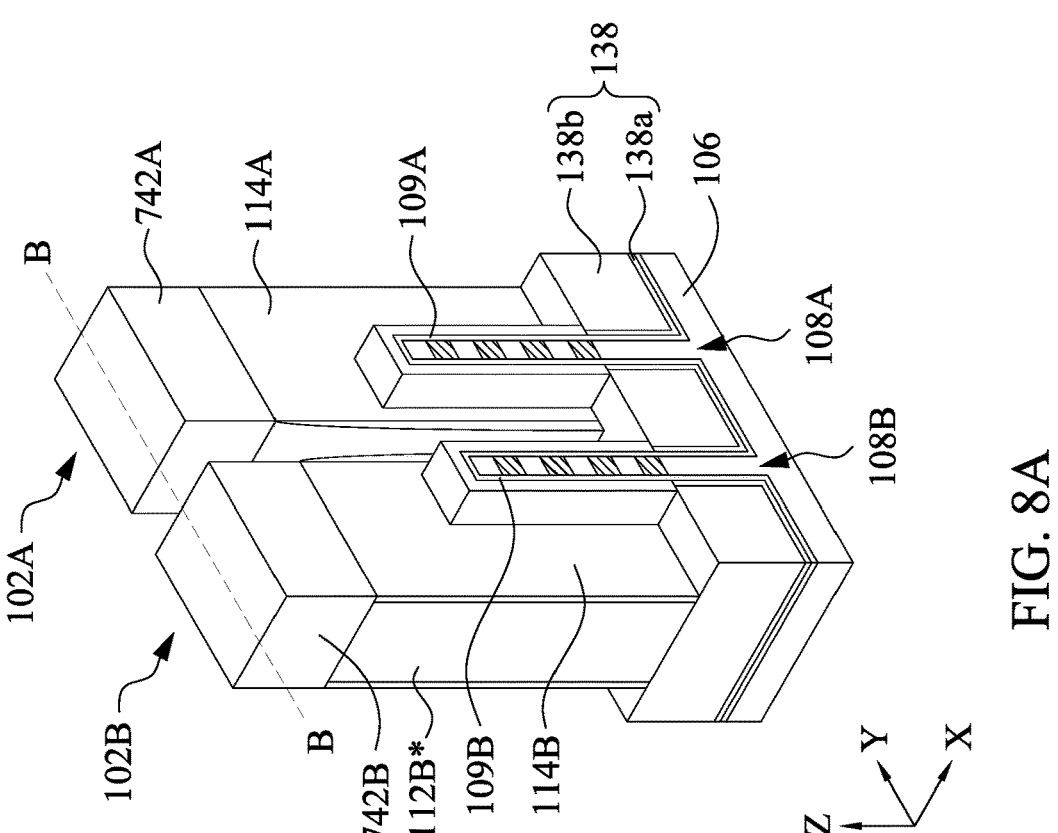
Figure 9B:
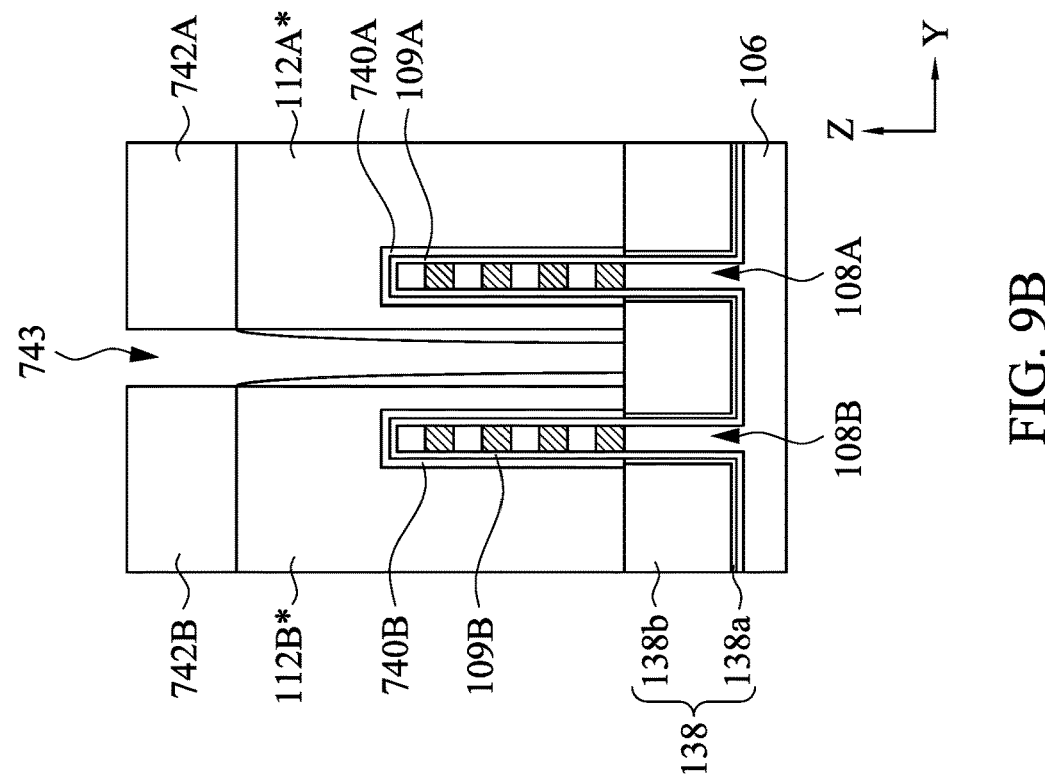
Figure 9A:
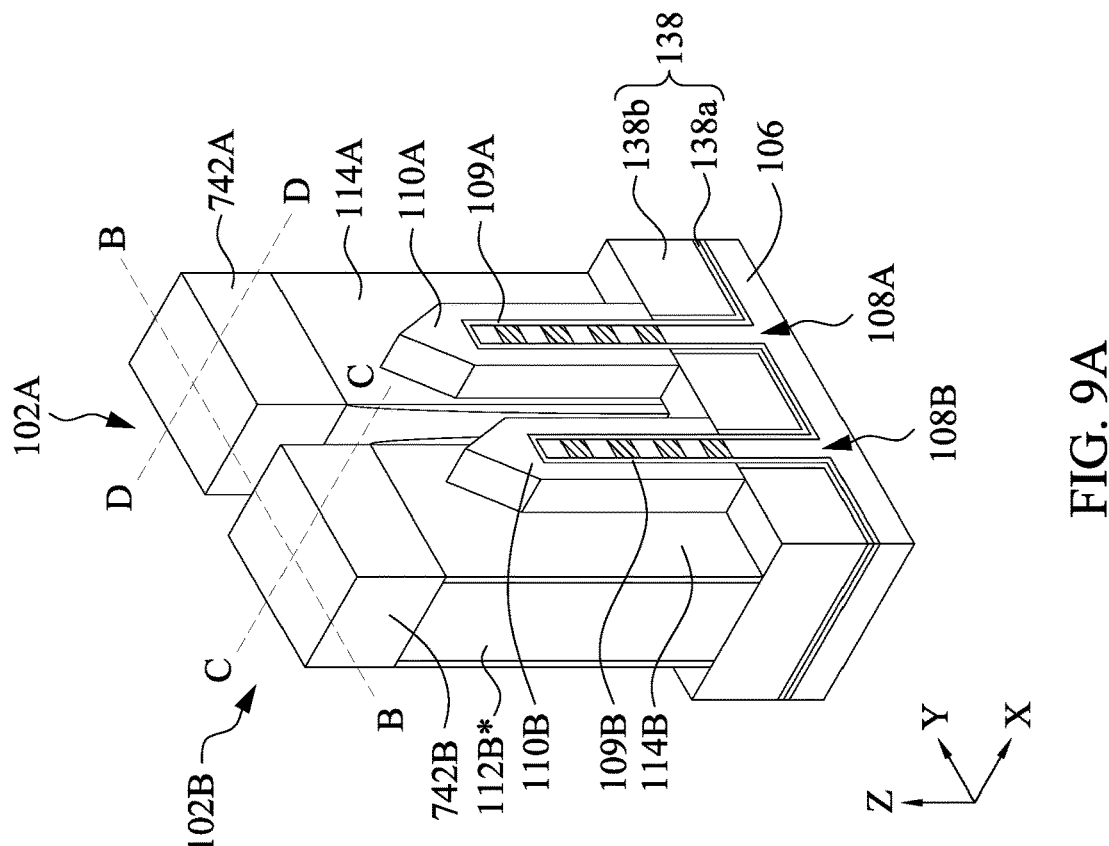

The annealing of the blanket deposited layer of oxide material for protective oxide layers 740A-740B can be followed by the formation of polysilicon structures 112A*-112B* as shown in FIGS. 7A-7B. During subsequent processing, polysilicon structures 112A*-112B* can be replaced in a gate replacement process to form gate structures 112A-112B, respectively. In some embodiments, the process for forming polysilicon structures 112A*-112B* can include blanket depositing a layer of polysilicon material on the annealed layer of oxide material for protective oxide layers 740A-740B and etching the blanket deposited layer of polysilicon material through patterned hard mask layers 742A-742B formed on the layer of polysilicon material. In some embodiments, the polysilicon material can be undoped and hard mask layers 742A-742B can include an oxide layer and/or a nitride layer. The oxide layer can be formed using a thermal oxidation process and the nitride layer can be formed by LPCVD or PECVD. Hard mask layers 742A-742B can protect polysilicon structures 112A*-112B* from subsequent processing steps (e.g., during formation of spacers 114A-114B, epitaxial fin regions 110A-110B, ILD layer 118, and/or ESL 116).

The blanket deposition of the layer of polysilicon material can include CVD, PVD, ALD, or other suitable deposition processes. In some embodiments, the etching of the blanket deposited layer of polysilicon material can include a dry etching process, a wet etching process, or a combination thereof. In some embodiments, the etching of the blanket deposited layer of polysilicon material can include four etching steps. The first polysilicon etch step can include using a gas mixture having hydrogen bromide (HBr), oxygen ($O_2$), fluoroform ($CHF_3$), and chlorine ($Cl_2$). The second polysilicon etch step can include using a gas mixture having HBr, $O_2$, $Cl_2$, and nitrogen ($N_2$) at a pressure of about 45 mTorr to about 60 mTorr. The third polysilicon etch step can include using a gas mixture having HBr, $O_2$, $Cl_2$, $N_2$, and argon (Ar) at a pressure of about 45 mTorr to about 60 mTorr. The fourth polysilicon etch step can include using a gas mixture having HBr, $O_2$, $Cl_2$, and $N_2$ at a pressure of about 45 mTorr to about 60 mTorr. Along with the polysilicon material, the fourth polysilicon etch step can remove portions of the annealed blanket deposited layer of oxide material for protective oxide layers 740A-740B that are not covered by polysilicon structures 112A*-112B*, according to some embodiments. The first polysilicon etch step can have a higher polysilicon etch rate than the second, third, and/or fourth polysilicon etch steps. The first polysilicon etch step is used to etch unwanted portions of the blanket deposited layer of polysilicon material above fin structures 108A*-108B*. The second, third, and fourth polysilicon etch steps are used to etch unwanted portions of the blanket deposited layer of polysilicon material within high aspect ratio spaces 743.

In some embodiments, vertical dimensions of polysilicon structures 112A*-112B* along a Z-axis on top surfaces of fin structures 108A-108B can be in a range from about 40 nm to about 60 nm. Polysilicon structures 112A*-112B* can have an aspect ratio equal to or greater than about 9 (e.g., about 10, about 12, about 15, about 18, or about 20), where aspect ratio is a ratio of a vertical dimension along a Z-axis to a horizontal dimension along a Y-axis of polysilicon structures 112A*-112B*. In some embodiments, horizontal dimensions between center lines of adjacent polysilicon structures 112A*-112B* along a Y-axis (e.g., spacing) can be in a range from about 30 nm to about 70 nm.

Following the formation of polysilicon structures 112A*-112B*, the portions of the blanket deposited layer of oxide that are not covered by polysilicon structures 112A*-112B* can be removed by a dry or a wet etch process if they are not removed during the fourth polysilicon etch step. In some embodiments, protective oxide layers 740A-740B can have vertical dimensions (e.g., thickness on top surface of fin structures 108A-108B) along a Z-axis and horizontal dimensions (e.g., thickness on sidewalls of fin top portions 108A2-108B2) along a Y-axis ranging from about 1 nm to about 3 nm. In some embodiments, the vertical dimensions can be equal to or greater than the horizontal dimensions. The presence of protective oxide layers 740A-740B allow etching polysilicon material from high aspect ratio spaces 743 (e.g., aspect ratio greater than 1:15, 1:18, or 1:20) without substantially etching and/or damaging fin structures 108A-108B during the formation of polysilicon structures 112A*-112B*.

Referring to FIG. 3, in operation 325, spacers are formed on sidewalls of the polysilicon structures and on the passivation layers. For example, spacers 114A-114B can be formed on sidewalls of polysilicon structures 112A*-112B* and on portions of passivation layers 109A-109B not covered by polysilicon structures 112A*-112B*, as described with reference to FIGS. 8A-8B. The process for forming spacers 114A-114B can include blanket depositing a layer of an insulating material (e.g., an oxide or a nitride material) on the structure of FIG. 7A by a CVD, a PVD, or an ALD process followed by photolithography and an etching process (e.g., reactive ion etching or other dry etching process using a chlorine or fluorine based etchant). An additional process can be carried out to selectively remove the insulating material from portions of passivation layers 109A-109B not covered by polysilicon structures 112A*-112B*. The additional etch process can be a dry etch process with etchants having CH$_4$, oxygen, and/or CH$_3$F. The ratio of flow rates of CH$_4$, oxygen, and CHF can range from about 1:1:1 to about 1:2:4. The dry etch process can be carried out at a bias voltage ranging from about 300 V to about 450 V.

Referring to FIG. 3, in operation 330, epitaxial fin regions are formed on the passivation layers. For example, epitaxial fin regions 110A-110B can be formed on portions of passivation layers 109A-109B not covered by polysilicon structures 112A*-112B*, as described with reference to FIGS. 9A-9B. Epitaxial fin regions 110A-110B can be formed simultaneously or can be formed sequentially. In some embodiments, epitaxial fin regions 110A-110B with the same conductivity type (e.g., n-type or p-type) can be formed simultaneously and epitaxial fin regions 110A-110B with conductivity type different from each other can be formed sequentially. For forming epitaxial fin regions 110A-110B sequentially, FET 102B can be protected with a photoresist layer (not shown) or other suitable protective layers and epitaxial fin region 110A can be formed on passivation layer 109A of the unprotected FET 102A. Following the formation of epitaxial fin region 110A, the photoresist layer or other suitable protective layers can be removed from FET 102B and FET 102A can be protected with another photoresist layer (not shown) or other suitable protective layers, which can be followed by growing epitaxial fin region 110B on passivation layer 109B of the unprotected FET 102B.

In some embodiments, epitaxial fin regions 110A-110B can be grown by (i) CVD, such as low pressure CVD (LPCVD), atomic layer CVD (ALCVD), ultrahigh vacuum CVD (UHVCVD), reduced pressure CVD (RPCVD), or any suitable CVD; (ii) molecular beam epitaxy (MBE) processes; (iii) any suitable epitaxial process; or (iv) a combination thereof. In some embodiments, epitaxial fin regions 110A-110B can be grown by an epitaxial deposition/partial etch process, which repeats the epitaxial deposition/partial etch process at least once. In some embodiments, epitaxial fin regions 110A-110B can be p-type or n-type. P-type epitaxial fin regions 110A-110B can include SiGe and can be in-situ doped during the epitaxial growth process using p-type dopants, such as boron, indium, or gallium. For p-type in-situ doping, p-type doping precursors such as, but not limited to, diborane (B2H6), boron trifluoride (BF3), and/or other p-type doping precursors can be used. N-type epitaxial fin regions 110A-110B can include Si without any substantial amount of Ge and can be in-situ doped during the epitaxial growth process using n-type dopants, such as phosphorus or arsenic. For n-type in-situ doping, n-type doping precursors such as, but not limited to, phosphine (PH3), arsine (AsH3), and/or other n-type doping precursor can be used.

Referring to FIG. 3, in operation 335, nanostructured channel regions are formed in the fin structures. For example, nanostructured channel regions 120B and 122B can be formed sequentially in regions of fin top portions 108A2-108B2 underlying polysilicon structures 112A*-112B*, as described with reference to FIGS. 10A-13B. Prior to the formation of nanostructured channel regions 120B and 122B, ESL 116 can be deposited on the structure of FIG. 9A and ILD 118 can be deposited on ESL 116.

In some embodiments, ESL 116 can be formed of materials including SiN$_x$, SiO$_x$, SiON, SiC, SiCN, BN, SiBN, SiCBN, or a combination thereof. The formation of ESL 116 can include blanket depositing a layer of material for ESL 116 on the structure of FIG. 9A using PECVD, sub atmospheric chemical vapor deposition (SACVD), LPCVD, ALD, high-density plasma (HDP), plasma enhanced atomic layer deposition (PEALD), molecular layer deposition (MLD), plasma impulse chemical vapor deposition (PICVD), or other suitable deposition methods.

Figure 10B:
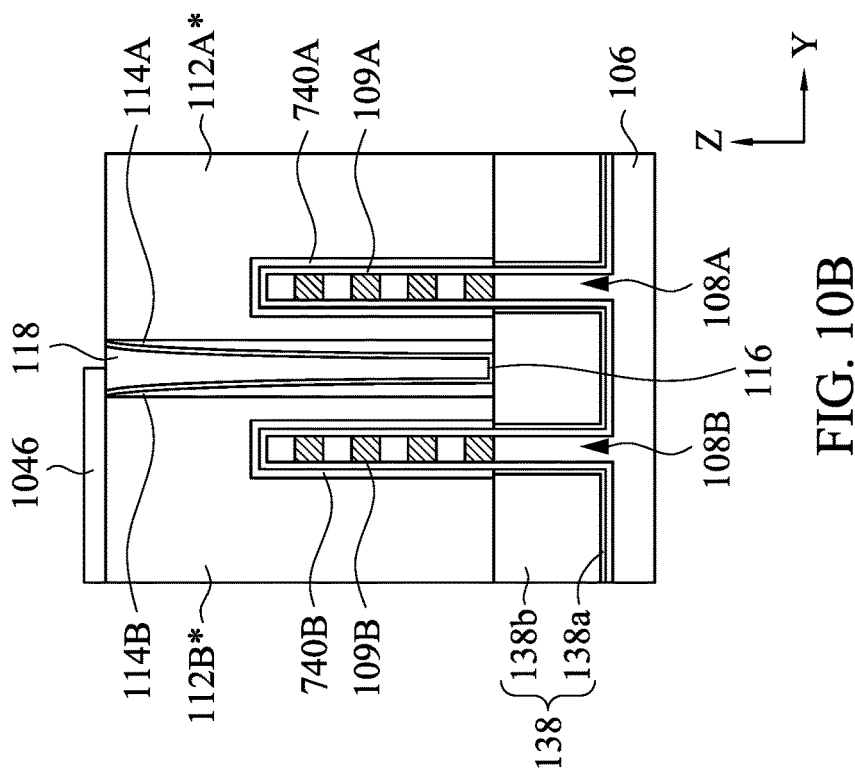
Figure 10A:
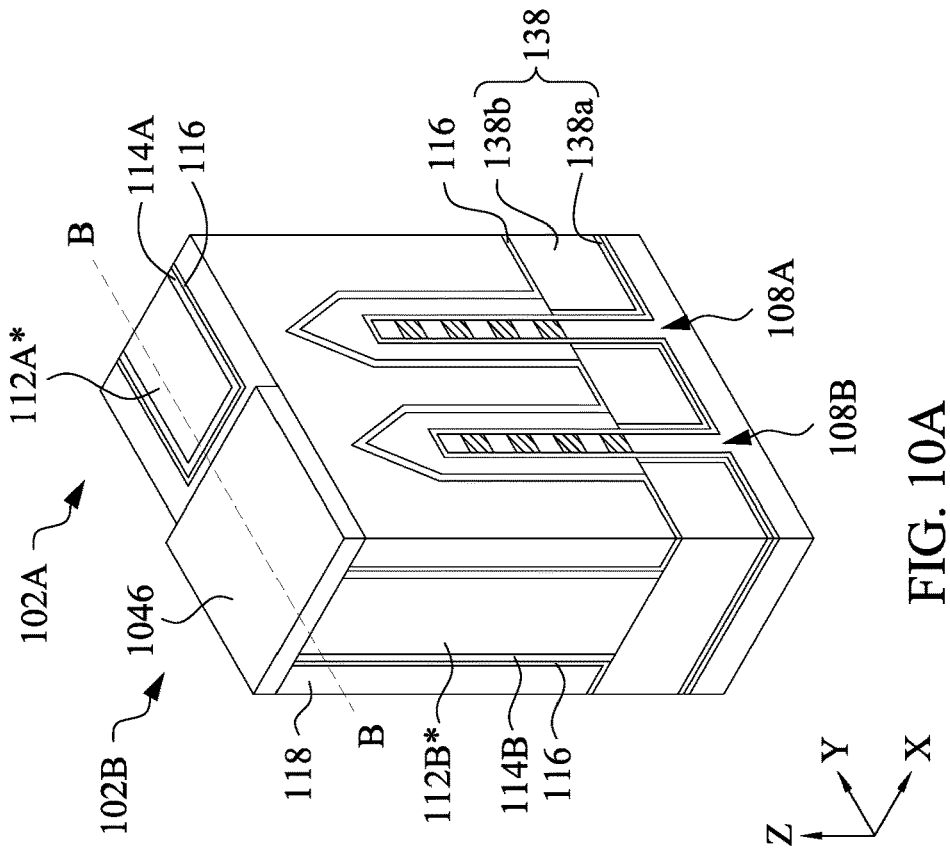

The blanket deposition of the layer of material for ESL 116 can be followed by a blanket deposition of a layer of dielectric material for ILD 118. In some embodiments, the dielectric material can be silicon oxide. The layer of dielectric material can be deposited using a deposition method suitable for flowable dielectric materials (e.g., flowable silicon oxide, flowable silicon nitride, flowable silicon oxynitride, flowable silicon carbide, or flowable silicon oxycarbide). For example, flowable silicon oxide can be deposited using FCVD process. The blanket deposition process can be followed by a thermal annealing of the deposited layer of dielectric material in steam at a temperature ranging from about 200° C. to about 700° C. for a period ranging from about 30 minutes to about 120 minutes. The thermal annealing can be followed by a CMP process to coplanarize top surfaces of ESL 116, ILD 118, spacers 114A-114B, and polysilicon structures 112A*-112B* with each other as shown in FIG. 10A. During the CMP process, hard mask layers 742A-742B can be removed.

Figure 11B:
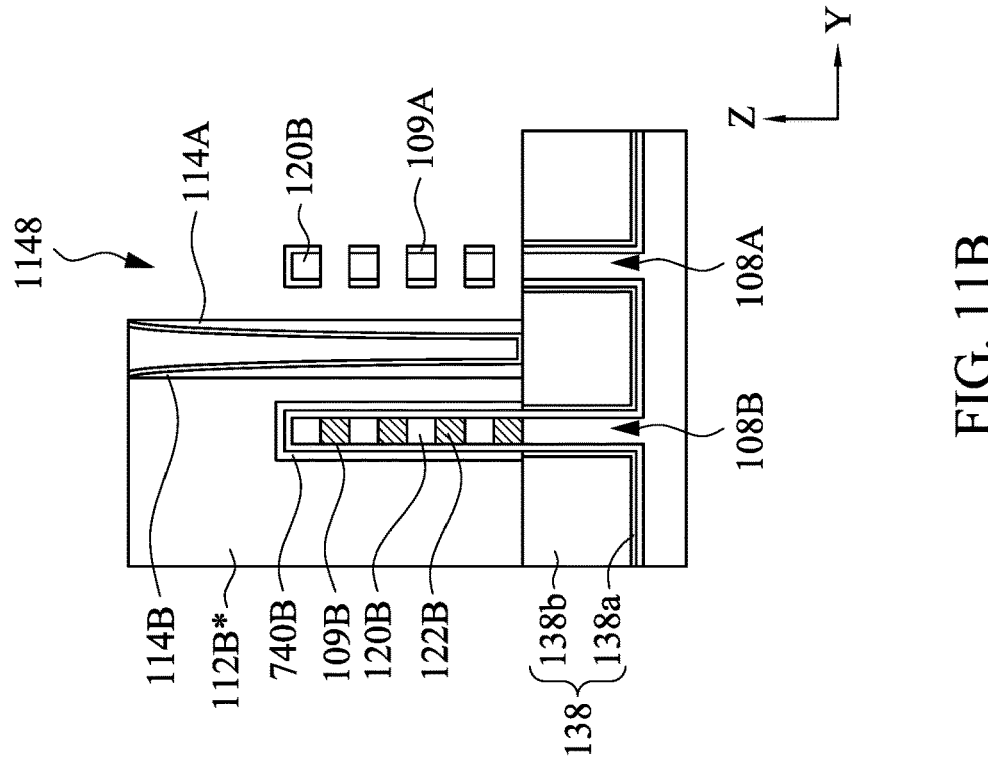
Figure 11A:
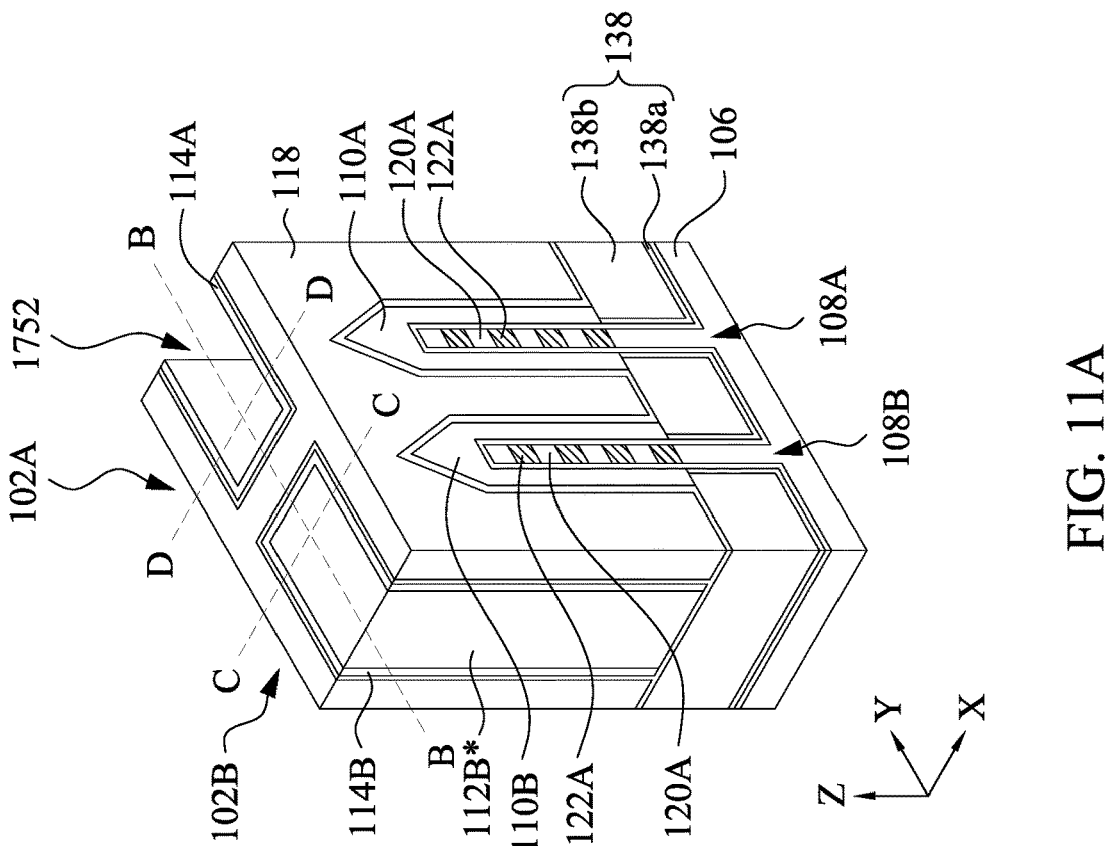

Following the CMP process, nanostructured channel regions 120B of FET 102A can be formed as shown in FIG. 11B. The process for forming nanostructured channel regions 120B can include sequential steps of (i) forming a photoresist layer 1046 on FET 102B as shown in FIGS. 10A-10B, (ii) etching polysilicon structure 112A* and protective oxide layer 740A from the structure of FIG. 10A, and (iii) etching second fin regions 122B of fin top portion 108A2 from the structure of FIG. 10A. In some embodiments, polysilicon structure 112A* and protective oxide layer 740A can be etched using the first, second, third, and/or fourth polysilicon etch steps described in operation 320. In some embodiments, second fin regions 122B can include SiGe and the etching of second fin regions 122B can include using a dry etching process that has higher etch selectivity towards SiGe than Si. For example, halogen-based chemistries can exhibit etch selectivity that is higher for Ge than for Si. Therefore, halogen gases can etch SiGe faster than Si. In some embodiments, the halogen-based chemistries can include fluorine-based and/or chlorine-based gasses. Alternatively, the etching of second fin regions 122B can include using a wet etching process with higher selectivity towards SiGe than Si to form the structure of FIG. 11B. For example, the wet etching process can include using a mixture of sulfuric acid ($H_2SO_4$) and hydrogen peroxide ($H_2O_2$) (SPM) and/or a mixture of ammonia hydroxide ($NH_4OH$) with $H_2O_2$ and deionized (DI) water (APM). The parameters and etchants for the etching of second fin regions 122B can be controlled such that fin regions 120A and 122A underlying epitaxial fin regions 110A are not removed.

Figure 12B:
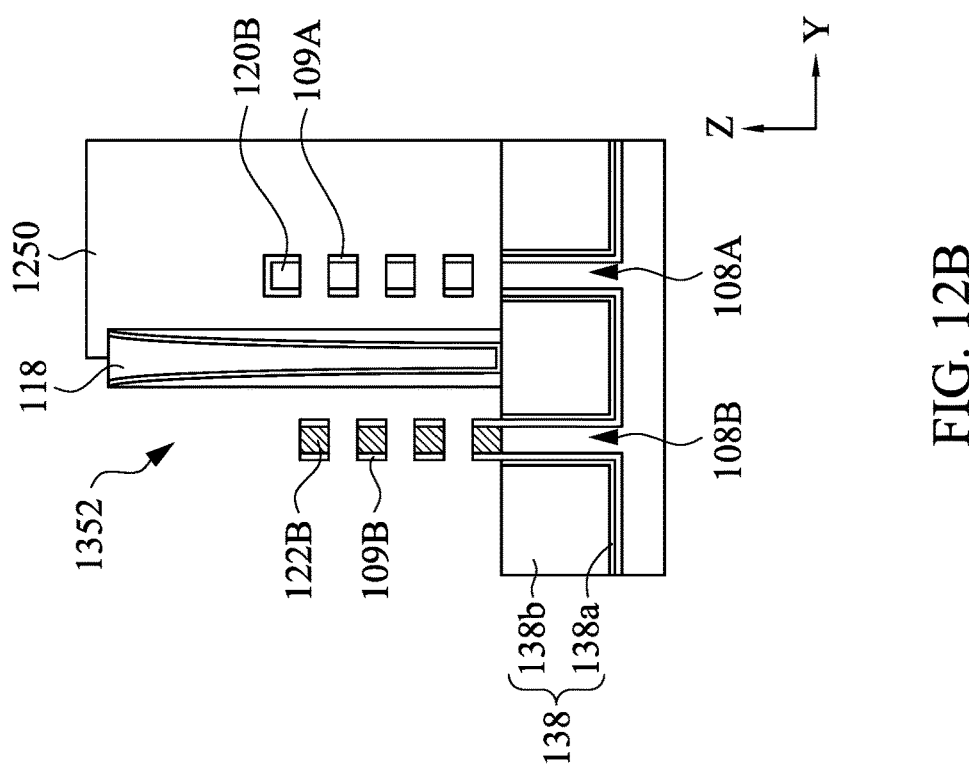
Figure 12A:
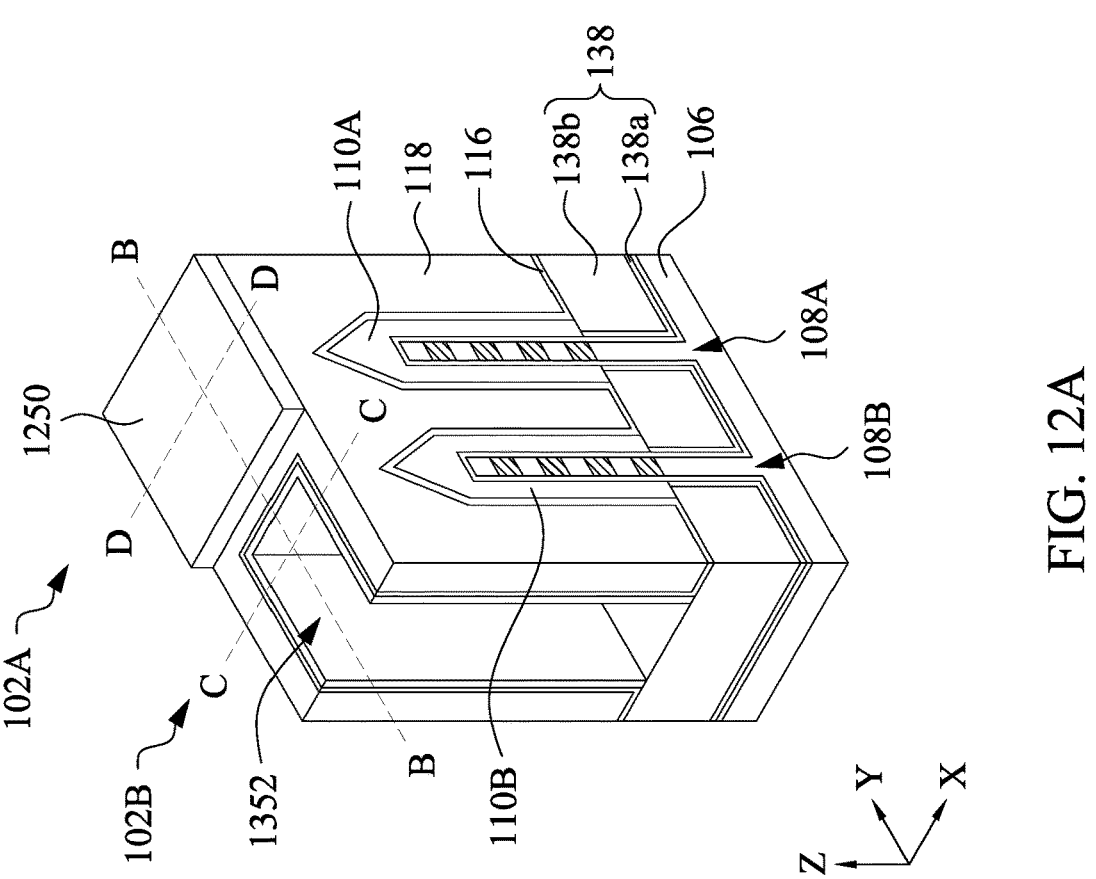
Figure 13B:
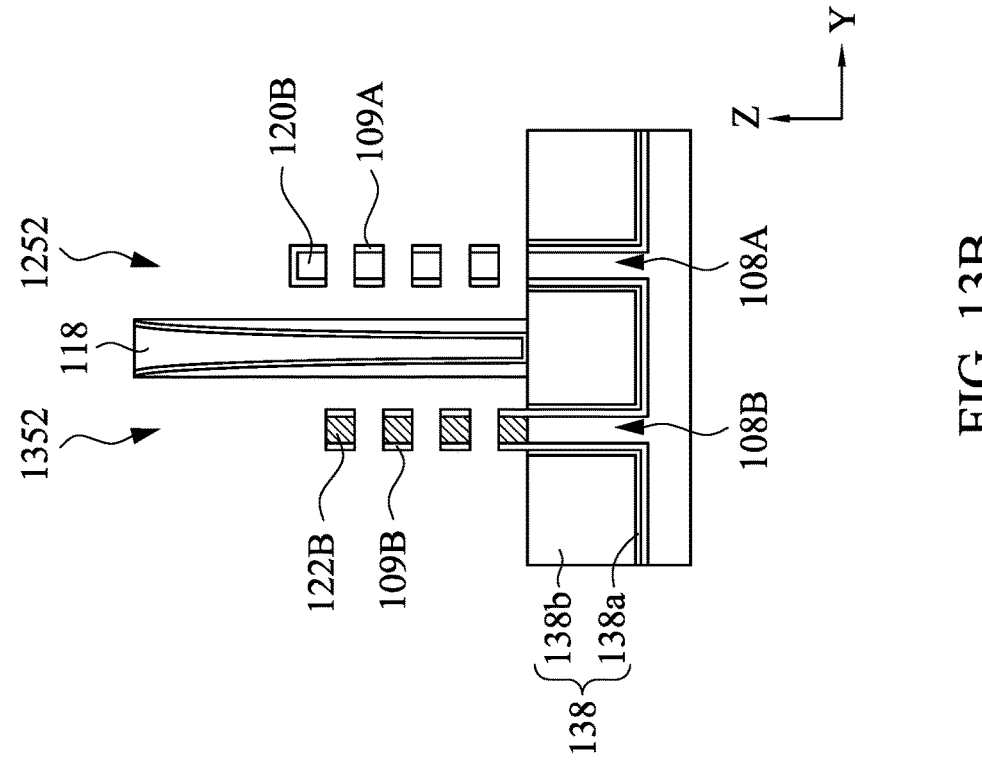
Figure 13A:
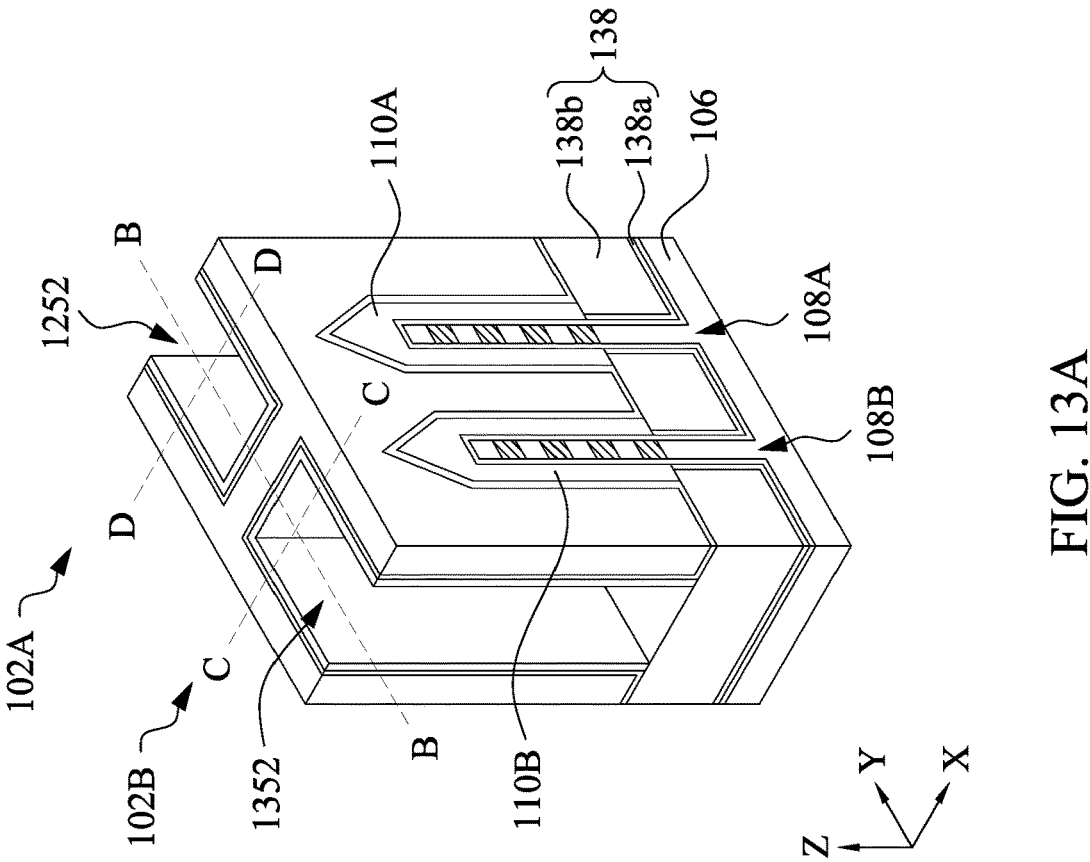

Following the etching of second fin regions 122B of fin top portions 108A2, nanostructured channel regions 122B of FET 102B can be formed as shown in FIG. 12B. The process for forming nanostructured channel regions 122B can include sequential steps of (i) removing photoresist layer 1046, (ii) forming a photoresist layer 1250 within opening 1148 (shown in FIG. 11B) to protect nanostructured channel regions 120A as shown in FIG. 12B, (iii) etching polysilicon structure 112B* and protective oxide layer 740B, and (iv) etching second fin regions 120B of fin top portion 108B2. Similar to the etching of polysilicon structure 112A*, polysilicon structure 112B* and protective oxide layer 740B can be etched using the first, second, third, and/or fourth polysilicon etch steps described in operation 320. In some embodiments, second fin regions 120B can include Si without any substantial amount of Ge and can be etched in a wet etch process with etchants including $NH_4OH$ and HCl that has higher etch selectivity towards Si than SiGe to form the structure of FIG. 12B. The parameters and etchants for the etching of fin regions 120B can be controlled such that fin regions 120A and 122A underlying epitaxial fin regions 110B are not removed. Following the formation of nanostructured channel regions 122B of FET 102B, photoresist layer 1250 can be removed from opening 1148 to form the structure of FIGS. 13A-13B.

Referring to FIG. 3, in operation 340, gate-all-around (GAA) structures or nanosheet (NS) structures are formed on the nanostructured channel regions. For example, gate structures 112A-112B can be formed wrapped around nanostructured channel regions 120B and 122B, as described with reference to FIGS. 13A-13B and 1B-1D. The process for forming gate structures 112A-112B can include the sequential steps of (i) blanket depositing a layer of dielectric material for gate dielectric layers 128A-128B on the structure of FIG. 13A, (ii) blanket depositing a layer of work function metal for gate work function metal layers 130A-130B on the layer of dielectric material, and (iii) blanket depositing a layer of conductive material for gate metal fill layers 132A-132B on the layer of work function metal until openings 1148 and 1352 are filled. In some embodiments, as shown in FIG. 1B, the layers of dielectric material, and work function metal, can each form conformal layers within openings 1148 and 1352 (shown in FIG. 13B).

The layer of dielectric material for gate dielectric layers 128A-128B can include silicon oxide and can be formed by CVD, atomic layer deposition (ALD), physical vapor deposition (PVD), e-beam evaporation, or other suitable processes. In some embodiments, the layer of dielectric material can include (i) a layer of silicon oxide, silicon nitride, and/or silicon oxynitride, (ii) a high-k dielectric material such as, for example, hafnium oxide ($HfO_2$), $TiO_2$, HfZrO, $Ta_2O_3$, $HfSiO_4$, $ZrO_2$, $ZrSiO_2$, (iii) a high-k dielectric material having oxides of Li, Be, Mg, Ca, Sr, Sc, Y, Zr, Al, La, Ce, Pr, Nd, Sm, Eu, Gd, Tb, Dy, Ho, Er, Tm, Yb, or Lu, or (iv) a combination thereof. High-k dielectric layers can be formed by ALD and/or other suitable methods.

The layer of work function metal for work function metal layers 130A-130B can include Al, Cu, W, Ti, Ta, TiN, TaN, NiSi, CoSi, Ag, TaC, TaSiN, TaCN, TiAl, TiAlN, WN, metal alloys, and/or combinations thereof. In some embodiments, the layer of work function metal can include Al-doped metal, such as Al-doped Ti, Al-doped TiN, Al-doped Ta, or Al-doped TaN. The layer of work function metal can be deposited using a suitable process such as ALD, CVD, PVD, plating, or combinations thereof. The layer of conductive material for gate electrodes 132 can include Ti, Ag, Al, TiAlN, TaC, TaCN, TaSiN, Mn, Zr, TiN, TaN, Ru, Mo, WN, Cu, W, Co, Ni, TiC, TiAlC, TaAlC, metal alloys, and/or combinations thereof and can be formed by ALD, PVD, CVD, or other suitable deposition processes. The deposited layers of dielectric material, work function metal, and conductive material can be planarized by a CMP process to form the structure of FIG. 1A. The CMP process can substantially coplanarize top surfaces of gate dielectric layers 128A-128B, gate work function metal layers 130A-130B, and gate metal fill layers 132A-132B with top surface of ILD layer 118 as shown in FIGS. 1A-1D.

The formation of gate structures 112A-112B can be followed by formation of other elements such as S/D contacts, gate contacts, vias, interconnect metal layers, dielectric layers, passivation layers, etc., which are not shown for the sake of clarity.

The present disclosure provides example structures and methods for reducing resistance in active regions (e.g., nanostructured channel regions 120B and 122B) of FET devices (e.g., FETs 102A-102B). Reducing resistance in the active regions can increase the drive current of the FET devices, thus resulting in improved FET device performance.

The example structures and methods provide passivation layers 109A-109B on the active regions of FET devices to improve the surface quality of the active regions. The surface quality can be improved by mitigating surface defects with passivation layers 109A-109B. The surface defects on the active regions can be in the form of vacancies created by dangling bonds on the surface of the active regions. The vacancies can trap charge carriers traveling through the active regions of the FET devices during operation and reduce the drive current of the FET devices. Passivation layers 109A-109B can react with these dangling bonds to reduce or eliminate the dangling bond induced surface defects on the active regions. Eliminating such surface defects on the active regions of FET devices with passivation layers 109A-109B can improve the drive current of the FET devices by about 20% to about 50% compared to the drive current of FET devices without such passivation layers on their active regions.

In some embodiments, a semiconductor device includes a substrate, first and second source/drain (S/D) regions disposed on the substrate, nanostructured channel regions disposed between the first and second S/D regions, a passivation layer, and a nanosheet (NS) structure wrapped around the nanostructured channel regions. Each of the S/D regions have a stack of first and second semiconductor layers arranged in an alternating configuration and an epitaxial region disposed on the stack of first and second semiconductor layers. A first portion of the passivation layer is disposed between the epitaxial region and the stack of first and second semiconductor layers and a second portion of the passivation layer is disposed on sidewalls of the nanostructured channel regions.

In some embodiments, a semiconductor device includes a first field effect transistor (FET) with a first fin structure disposed on a substrate, a first passivation layer wrapped around the fin structure, a first epitaxial region of a first conductivity type disposed on the first passivation layer. The semiconductor device further includes a second FET with a second fin structure disposed adjacent to the first fin structure on the substrate, a second passivation layer wrapped around the second fin structure, and a second epitaxial region of a second conductivity type disposed on the second passivation layer, wherein the first and second conductivity types are different from each other.

In some embodiments, a method for fabricating a semiconductor device includes forming a fin structure with a stack of first and second semiconductor layers arranged in an alternating configuration on a substrate, depositing a passivation layer on the fin structure and the substrate, forming an epitaxial region on a first portion of the fin structure, forming nanostructured channel regions in a second portion of the fin structure, and forming a nanosheet (NS) structure wrapped around the nanostructured channel regions.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
forming a first semiconductor layer with first and second portions on a substrate;
forming a second semiconductor layer with third and fourth portions on the first semiconductor layer;
depositing a non-oxide dielectric layer on the first and second semiconductor layers;
removing the first portion of the first semiconductor layer;
depositing a gate dielectric layer surrounding the third portion of the second semiconductor layer; and
depositing a gate conductive layer on the gate dielectric layer.

2. The method of claim 1, wherein depositing the non-oxide dielectric layer comprises depositing a layer of nitride, fluoride, chloride, or sulfide on the first and second semiconductor layers.

3. The method of claim 1, wherein depositing the non-oxide dielectric layer comprises depositing the non-oxide dielectric layer on a top surface and sidewalls of the second semiconductor layer.

4. The method of claim 1, further comprising replacing the second portion of the first semiconductor layer and the fourth portion of the second semiconductor layer with an epitaxial layer.

5. The method of claim 1, further comprising removing the second portion of the first semiconductor layer and the fourth portion of the second semiconductor layer prior to depositing the gate dielectric layer.

6. The method of claim 1, further comprising depositing an oxide layer on the non-oxide dielectric layer.

7. The method of claim 1, further comprising forming a polysilicon structure on the non-oxide dielectric layer.

8. The method of claim 1, further comprising etching the substrate to form a fin-shaped base structure under the first semiconductor layer prior to forming the first semiconductor layer.

9. The method of claim 8, wherein depositing the non-oxide dielectric layer comprises depositing the non-oxide dielectric layer on sidewalls of the fin-shaped base structure.

10. The method of claim 1, further comprising depositing a nitride layer on the non-oxide dielectric layer.

11. A method, comprising:
forming, on a first fin-shaped base structure, a first nanostructured channel region with a dielectric layer on sidewalls of the first nanostructured channel region;
forming a second nanostructured channel region on a second fin-shaped base structure, wherein the first and second nanostructured channel regions are on different horizontal surface planes and wherein top surfaces of the first and second nanostructured channel regions are non-coplanar with each other;
forming a first source/drain region adjacent to a sidewall of the first nanostructured channel region;
forming a second source/drain region adjacent to a sidewall of the second nanostructured channel region, wherein the first and second source/drain regions have different conductivity types; and
forming first and second gate structures to surround the first and second nanostructured channel regions, respectively.

12. The method of claim 11, wherein forming the first nanostructured channel region comprises forming the first nanostructured channel region with a separation between a bottom surface of the first nanostructured channel region and a top surface of the first fin-shaped base structure.

13. The method of claim 11, wherein forming the first nanostructured channel region with the dielectric layer comprises depositing a non-oxide dielectric layer on the sidewalls of a nanostructured semiconductor layer.

14. The method of claim 11, wherein forming the second nanostructured channel region comprises forming the second nanostructured channel region in physical contact with a top surface of the second fin-shaped base structure.

15. The method of claim 11, further comprising depositing a passivation layer on sidewalls of the first fin-shaped base structure.

16. The method of claim 15, wherein depositing the passivation layer comprises depositing a layer of nitride, fluoride, chloride, or sulfide on the sidewalls of the first fin-shaped base structure.

17. A semiconductor device, comprising:
a substrate;
a nanostructured channel region disposed on the substrate;
a non-oxide dielectric layer disposed on sidewalls of the nanostructured channel region;
a source/drain region disposed adjacent to the nanostructured channel region; and
a gate structure disposed on the nanostructured channel region.

18. The semiconductor device of claim 17, wherein the source/drain region is in contact with the non-oxide dielectric layer.

19. The semiconductor device of claim 17, wherein the gate structure is disposed on the non-oxide dielectric layer.

20. The semiconductor device of claim 17, wherein the non-oxide dielectric layer comprises a layer of nitride, fluoride, chloride, or sulfide.

* * * * *